United States Patent
Yu et al.

(10) Patent No.: US 12,347,489 B2
(45) Date of Patent: Jul. 1, 2025

(54) CONTENT ADDRESSABLE MEMORY ARRAY DEVICE STRUCTURE

(71) Applicant: Taiwan Semiconductor Manufacturing Company, Ltd., Hsin-Chu (TW)

(72) Inventors: Dian-Sheng Yu, Hsinchu (TW); Chien-Chih Chen, Taichung (TW); Jhon Jhy Liaw, Hsinchu County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 193 days.

(21) Appl. No.: 18/301,440

(22) Filed: Apr. 17, 2023

(65) Prior Publication Data

US 2024/0170063 A1 May 23, 2024

Related U.S. Application Data

(60) Provisional application No. 63/384,526, filed on Nov. 21, 2022.

(51) Int. Cl.
G11C 16/04 (2006.01)
G11C 15/04 (2006.01)
H10B 10/00 (2023.01)

(52) U.S. Cl.
CPC .............. *G11C 15/04* (2013.01); *H10B 10/12* (2023.02)

(58) Field of Classification Search
CPC .................................. G11C 15/04; H10B 10/12
See application file for complete search history.

(56) References Cited

U.S. PATENT DOCUMENTS

| | | | | |
|---|---|---|---|---|
| 6,842,360 B1* | 1/2005 | Srinivasan | ............. | G11C 15/04 365/49.1 |
| 6,901,000 B1* | 5/2005 | Ichiriu | ................... | G11C 15/04 365/49.17 |
| 7,035,968 B1* | 4/2006 | Pereira | ................... | G11C 15/00 711/158 |

(Continued)

FOREIGN PATENT DOCUMENTS

| TW | 201820320 A | 6/2018 |
|---|---|---|
| TW | 1783762 B | 11/2022 |

OTHER PUBLICATIONS

Notice of Allowance received in corresponding Taiwanese patent application No. 112122587, dated Apr. 25, 2025, 8 pages.

*Primary Examiner* — Pho M Luu
(74) *Attorney, Agent, or Firm* — Cooper Legal Group, LLC

(57) ABSTRACT

A Content Addressable Memory (CAM) array includes a first and a second cell structure sharing a cell boundary. The first cell structure includes a first storage circuit and a first comparator circuit, the first comparator circuit includes a first transistor having a gate, a drain, and a source. The second cell structure includes a second storage circuit and a second comparator circuit, the second comparator circuit includes a second transistor having a gate, a drain, and a source. The CAM array further includes a first shared source contact landing on the source of the first transistor and the source of the second transistor. The first shared source contact connects the source of the first transistor to the source of the second transistor. And the first shared source contact extends across the shared cell boundary from the first cell structure to the second cell structure.

20 Claims, 21 Drawing Sheets

(56) References Cited

U.S. PATENT DOCUMENTS

| | | |
|---|---|---|
| 8,421,205 B2 | 4/2013 | Yang |
| 8,605,523 B2 | 12/2013 | Tao et al. |
| 8,630,132 B2 | 1/2014 | Cheng et al. |
| 8,661,389 B2 | 2/2014 | Chern et al. |
| 8,698,205 B2 | 4/2014 | Tzeng et al. |
| 8,760,948 B2 | 6/2014 | Tao et al. |
| 8,826,212 B2 | 9/2014 | Yeh et al. |
| 8,836,141 B2 | 9/2014 | Chi et al. |
| 9,183,933 B2 | 11/2015 | Liaw |
| 2014/0032871 A1 | 1/2014 | Hsu et al. |
| 2014/0153321 A1 | 6/2014 | Liaw |
| 2014/0153345 A1 | 6/2014 | Kim et al. |
| 2014/0177352 A1 | 6/2014 | Lum |
| 2014/0215420 A1 | 7/2014 | Lin et al. |
| 2014/0233330 A1 | 8/2014 | Ko et al. |
| 2014/0241077 A1 | 8/2014 | Katoch et al. |
| 2014/0264924 A1 | 9/2014 | Yu et al. |
| 2014/0269114 A1 | 9/2014 | Yang et al. |
| 2014/0282289 A1 | 9/2014 | Hsu et al. |
| 2014/0325466 A1 | 10/2014 | Ke et al. |
| 2017/0133092 A1 | 5/2017 | Gupta et al. |

\* cited by examiner

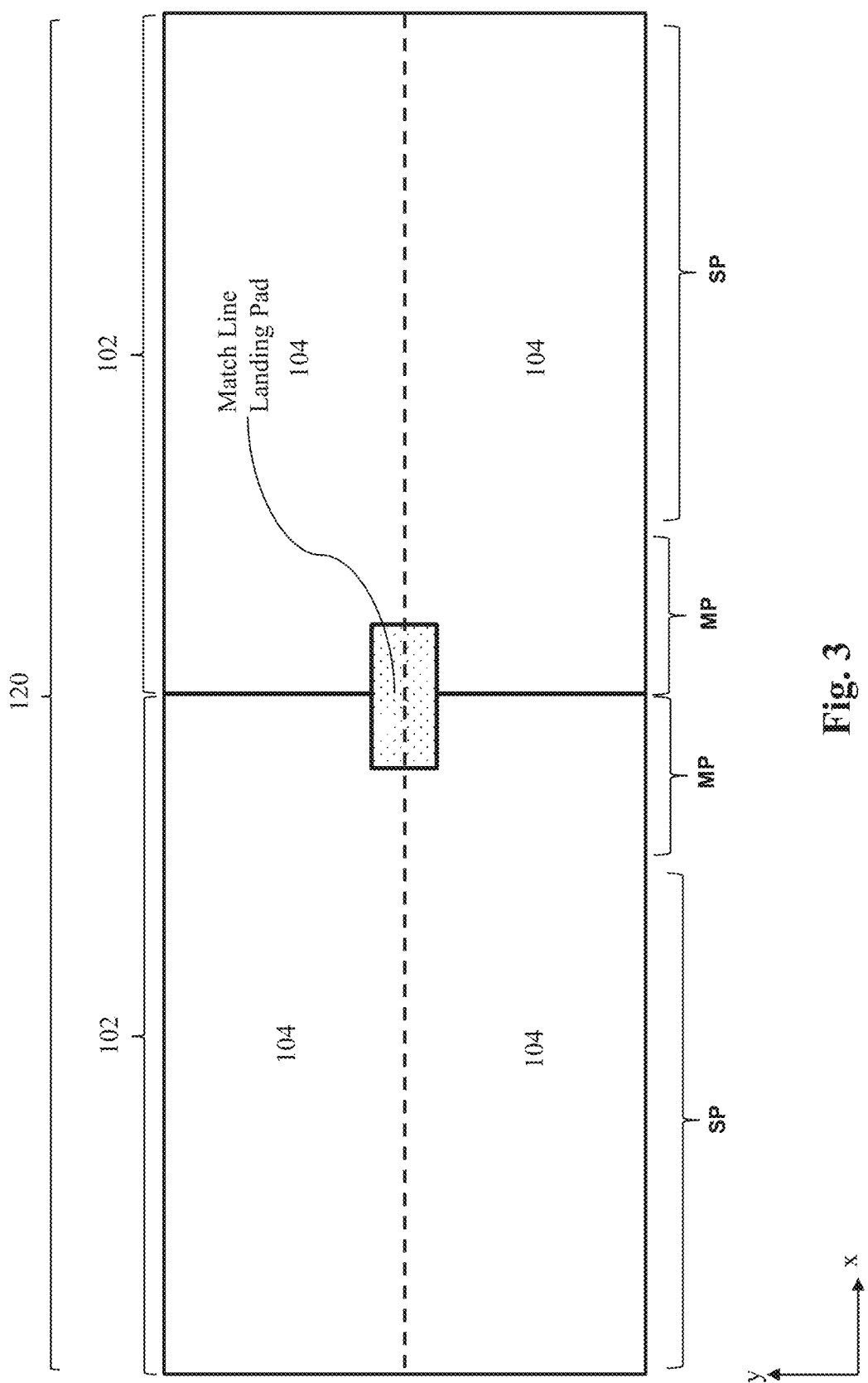

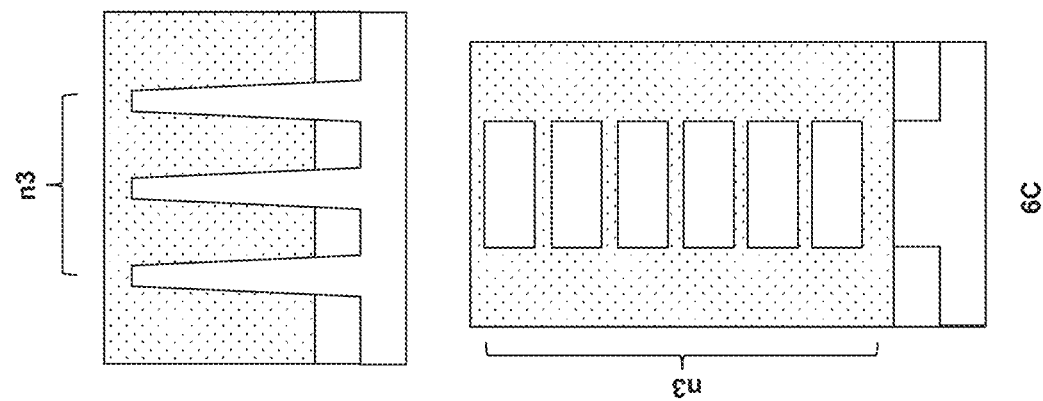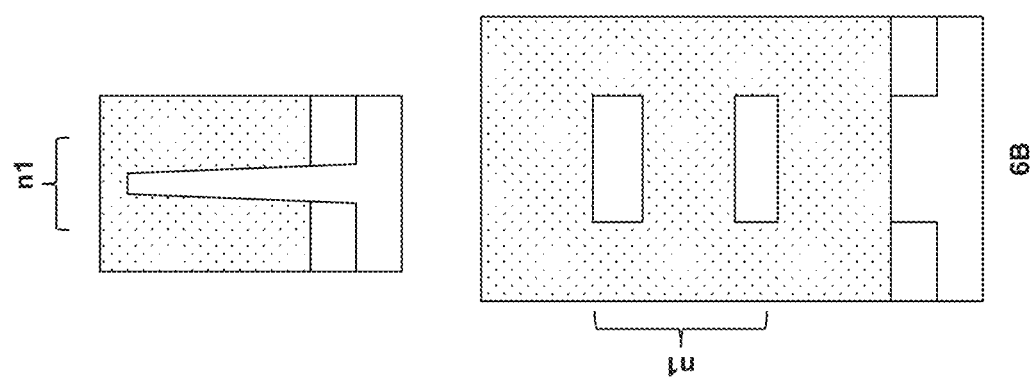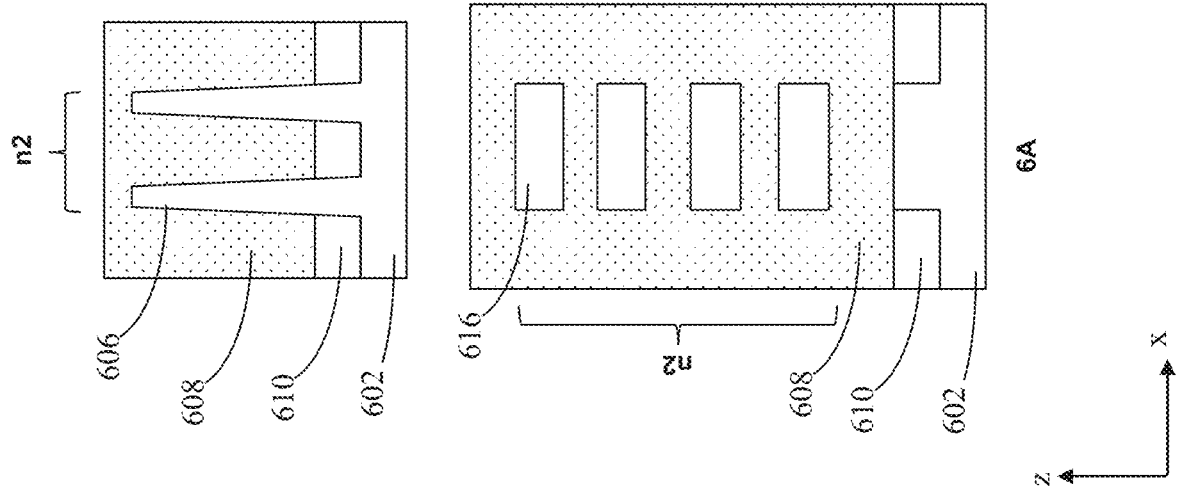
Fig. 6

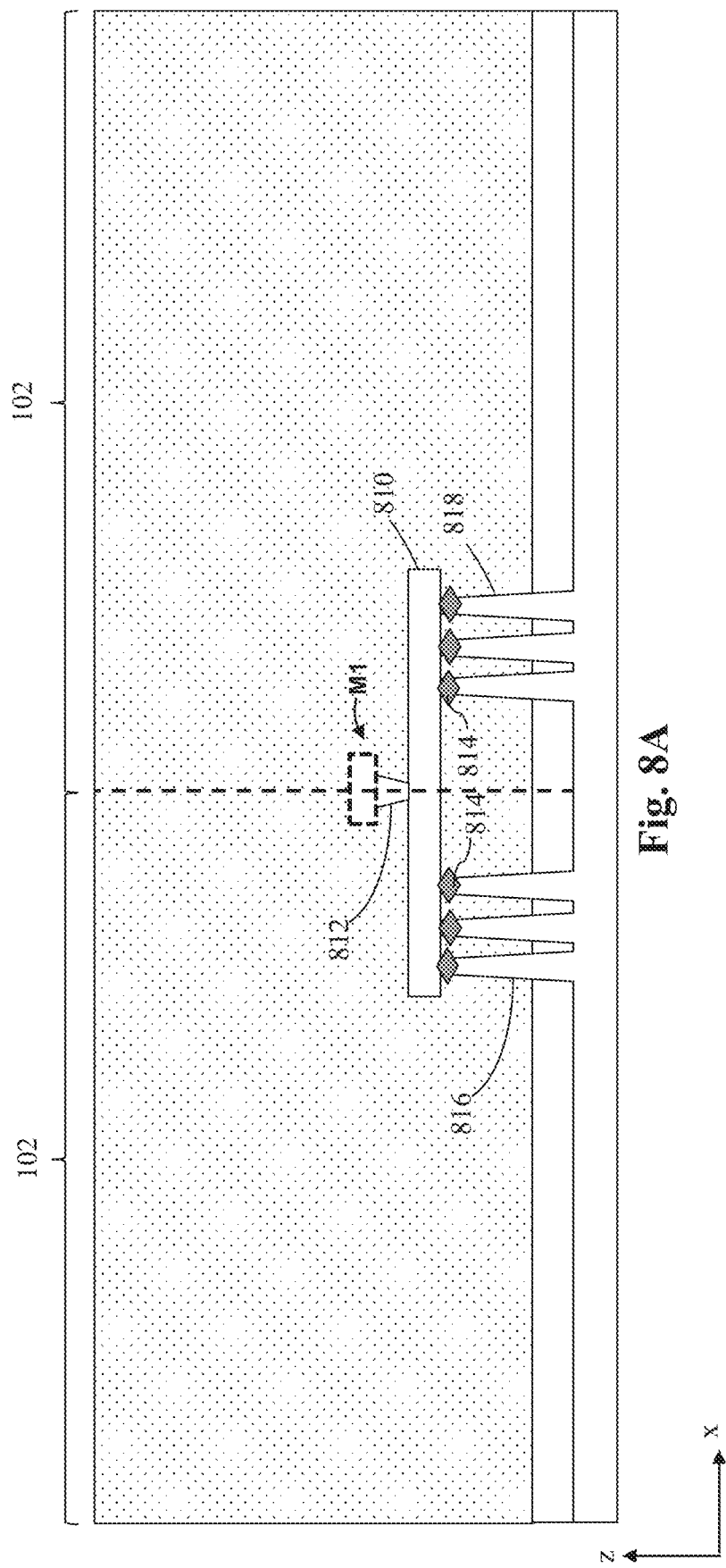

CONTENT ADDRESSABLE MEMORY ARRAY DEVICE STRUCTURE

PRIORITY DATA

This application claims priority to U.S. Provisional Patent Application Ser. No. 63/384,526 filed Nov. 21, 2022, the entire disclosure of which is incorporated herein by reference.

BACKGROUND

To keep up with device scaling while improving performance and power benefits, memory devices have seen continued development in the integrated circuit (IC) design industry. One type of memory device is the content addressable memory (CAM) device. Also known as associative memory, CAM provides access to stored data in memory by searching its content rather than its address. When a data word is applied to the CAM, the memory returns the match address when there is a match.

CAM is used in extremely fast data search and high-speed programing applications. These may include networking, database engines, neural networks, and cache memories. Unlike traditional memory, CAM enables a search operation to complete in a single clock cycle, where each bit in a data word is searched in parallel. Each CAM cell has a bit storage component to determine content and a bit comparison component to determine match. CAM may include binary content addressable memory (BCAM) or ternary content addressable memory (TCAM). BCAMs have two states in memory, either 1 or 0, and will require exact match to return a match address. However, in TCAMs, there is an extra "don't' care" state that will allow partial match. This added flexibility increases speed and performance.

As the feature sizes on IC chips continue to get scaled down, routing problems may arise for CAM devices. Therefore, although existing CAM devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

FIG. 3 is an array of memory cells taken from the TCAM array layout of FIG. 2 according to an embodiment of the present disclosure.

FIG. 6 is a cross-sectional view of the cell in FIG. 5A cut along the lines A-A', B-B', and C-C'.

FIGS. 8A and 8B are separate cross-sectional view embodiments of the example layout in FIG. 7 cut along the D-D' line.

DETAILED DESCRIPTION

Figure 1:
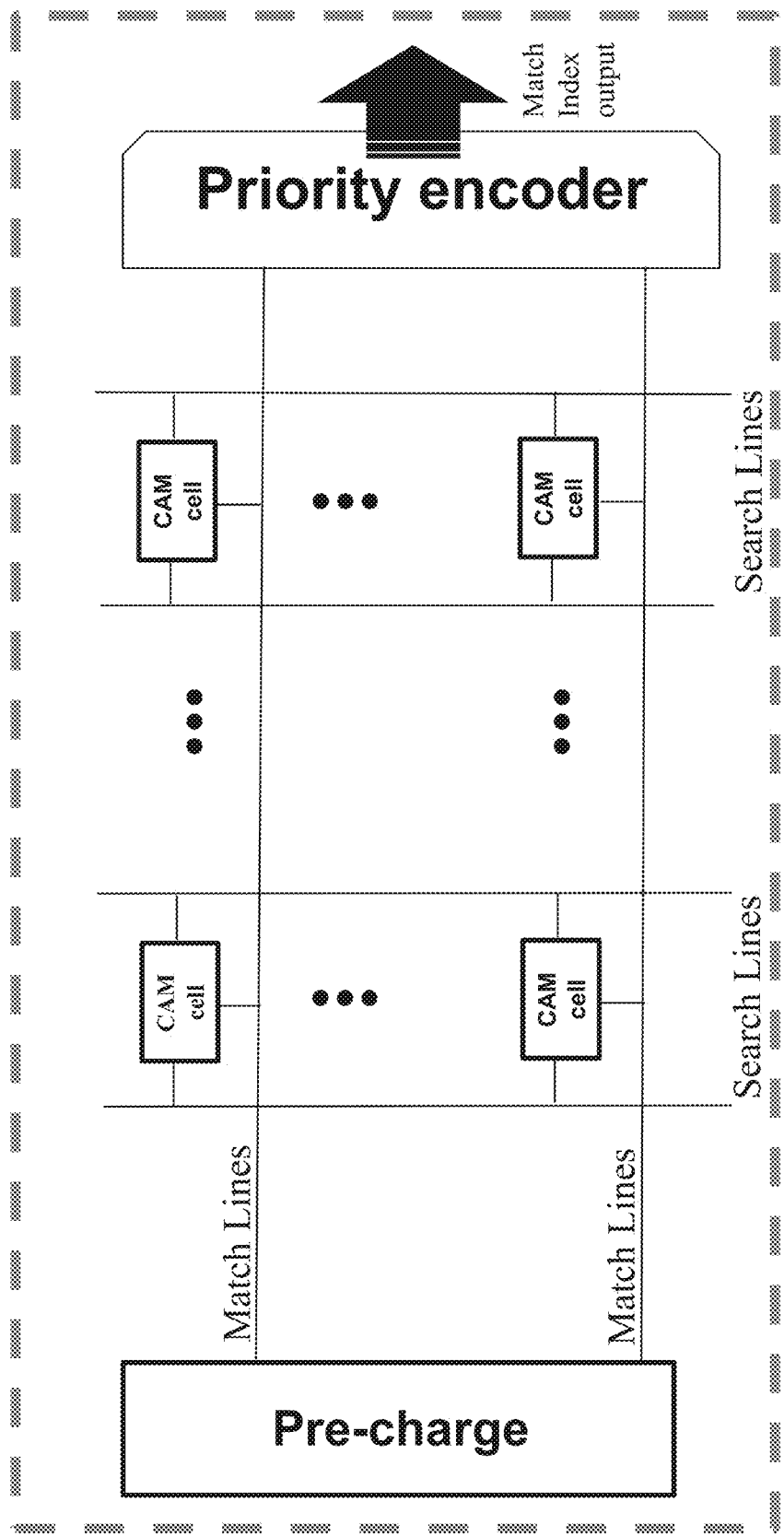
FIG. 1 is a schematic block diagram of a CAM device according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments disclosed herein will be described with respect to a specific context, namely a memory cell and array, and more particularly, a Ternary Content-Addressable Memory (TCAM) cell, a TCAM array, a boundary between two TCAM cells, and different metal layers within a TCAM cell or array. Various modifications are discussed with respect to embodiments; however, other modifications may be made to the disclosed embodiments while remaining within the scope of the subject matter. A person of ordinary skill in the art will readily understand modifications that may be made.

FIG. 1 illustrates a schematic block diagram of a CAM device according to an embodiment of the present disclosure. In operation, each CAM cell in a CAM device is addressed through different metal lines linking the cells together. These may include word lines, bit lines, search lines, and match lines. For a search operation, all of the match lines are pre-charged to a high voltage VDD. When there is a match, the match line of a particular word will remain at VDD and will be fed to a priority encoder for match index output. A match occurs when all the search line bits match all the CAM cell storage bits for a particular word. That is, a match line will remain at VDD only if all the CAM cells sharing the same match line have a match condition. If there is any mismatch in any cell that shares the same match line, the match line will discharge from VDD to low voltage VSS or ground. As will be described in more detail below, the CAM cell storage bits may be stored in a storage circuit and the match comparison may be performed through a comparator circuit. In one CAM cell, the storage circuit portion may be referred to as the storage port (SP) and the comparator circuit portion may be referred to as the match port (MP). Each CAM cell may be a BCAM cell or a TCAM cell. Although TCAM cell embodiments will be used to illustrate inventive aspects of the present disclosure, a person of ordinary skill in the art will readily understand modifications may be made for a BCAM embodiment.

Figure 2:
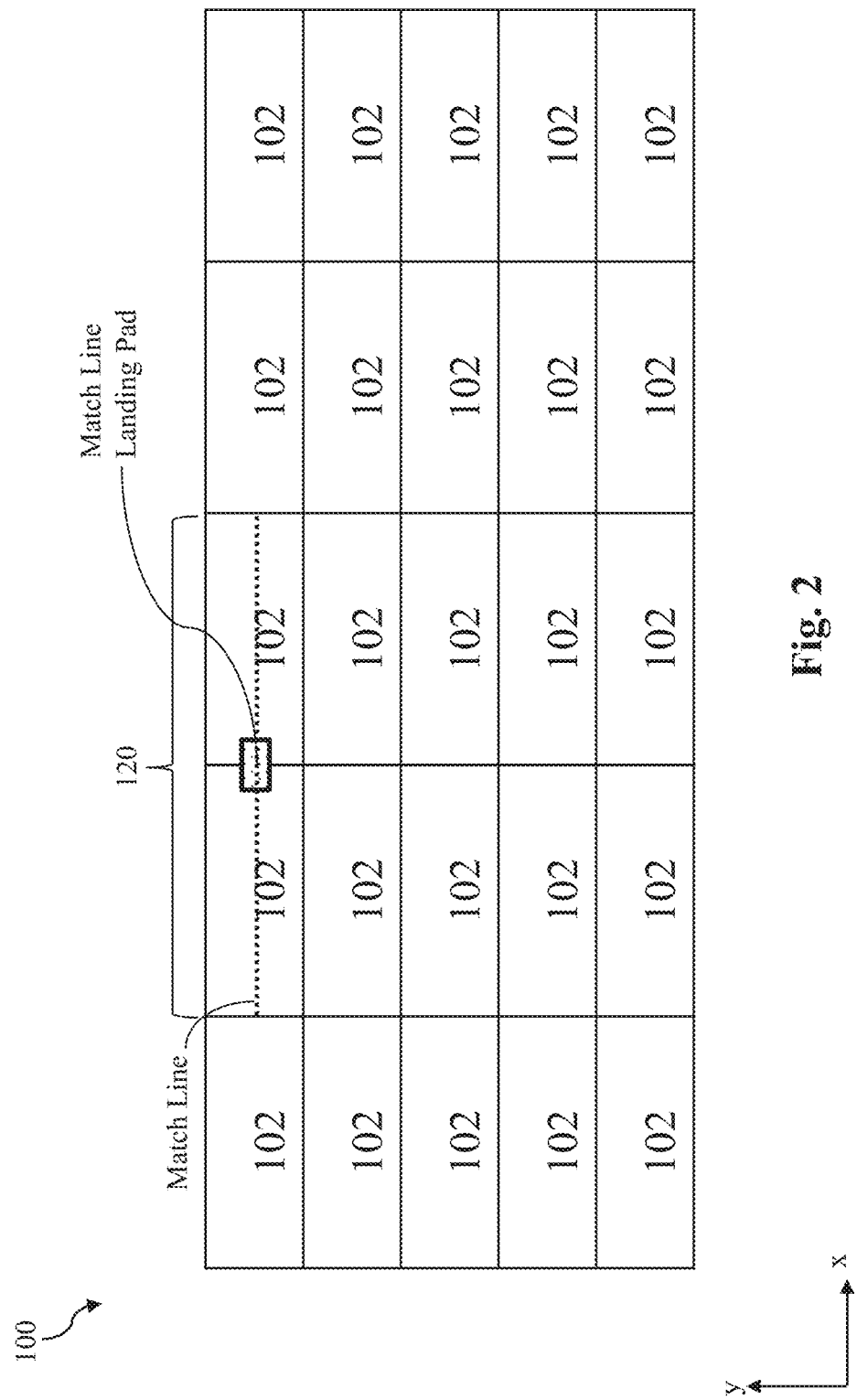
FIG. 2 is a layout of a TCAM array according to an embodiment of the present disclosure.

FIG. 2 illustrates a layout of a TCAM array 100 according to an embodiment of the present disclosure. The TCAM array 100 comprises a series of TCAM cells 102 that run along the x and y directions. Each TCAM cell is connected to each other at a cell boundary between cell columns and cell rows. In the TCAM array 100, a TCAM region 120 includes two TCAM cells 102. The TCAM region 120 has a match line that run across both TCAM cells 102 along the x direction. The match line crosses a cell boundary that runs across the y direction between the adjacent TCAM cells 102. At the cell boundary, there is a match line landing pad having a smaller width in the x direction that electrically connects to the match line.

FIG. 3 is an array of memory cells taken from the TCAM array 100 of FIG. 2 according to an embodiment of the present disclosure. Particularly, FIG. 3 shows the TCAM region 120 of FIG. 2 in more detail. The TCAM region 120 includes two adjacent TCAM cells 102 sharing a cell boundary that runs in the y direction. Each TCAM cells 102 may include two static random access memory (SRAM) cells 104. The SRAM cells 104 in each one of the TCAM cells 102 have a cell boundary that runs in the x direction as shown by a dashed line. Each TCAM cell 102 has a storage circuit portion SP and a match port portion MP. The two TCAM cells mirror each other such that their respective match port portions MP are positioned adjacent to each other by the shared cell boundary that runs in the y direction.

Figure 4A:
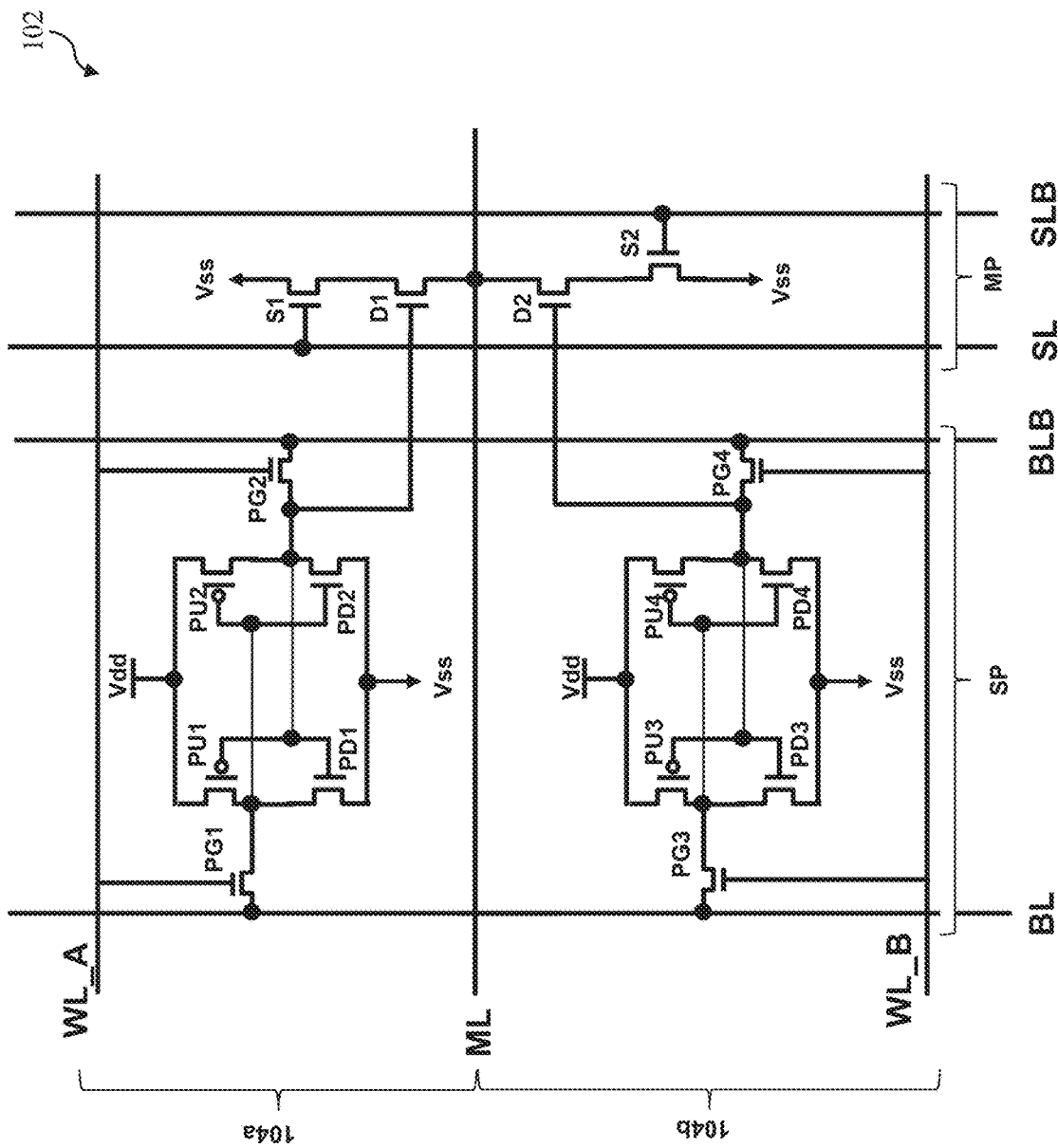
FIG. 4A is a circuit diagram of a regular stack TCAM cell according to an embodiment of the present disclosure.

FIG. 4A is a circuit diagram of a regular stack TCAM cell 102 according to an embodiment of the present disclosure. The regular stack TCAM cell 102 uses regular SRAM circuit architectures. Particularly, the TCAM cell 102 includes two SRAM circuits 104a and 104b, each SRAM circuit having 8 transistors and 2 ports. The TCAM cell 102 includes a storage circuit portion, also known as storage port SP, and a comparison circuit portion, also known as match port MP. The SP may include 12 transistors (6 transistors from each SRAM circuit). And the MP may include 4 transistors (2 transistors from each SRAM circuit).

Still referring to FIG. 4A, the first SRAM circuit 104a includes pull-up transistors PU1 and PU2; pull-down transistors PD1 and PD2; pass gate transistors PG1 and PG2; data gate transistor D1; and search gate transistor S1. The sources of PU1 and PU2 are coupled together and connected to high voltage Vdd. The sources of PD1 and PD2 are coupled together and connected to low source voltage Vss or ground. The gates of PU1 and PD1 are coupled together and connected to the common drains of PU2, PD2 and PG2. The gates of PU2 and PD2 are coupled together and connected to the common drains of PU1, PD1, and PG1. PU1, PU2, PD1, and PD2 forms a first set of cross coupled inverters to store a data bit. The source of PG1 is connected to a bit line BL and the source of PG2 is connected to a bit line bar BLB. The gates of PG1 and PG2 are connected to a first word line WL_A. A first output storage node at the common drain between PU2, PD2, and PG2 is coupled to the gate of the data gate transistor D1. The source of D1 is connected to a match line ML and the drain of D1 is connected to the drain of search gate transistor S1. The gate of S1 is connected to a search line SL and the source of S1 is connected to low voltage Vss or ground. For the first SRAM circuit 104a, the transistors PU1, PU2, PD1, PD2, PG1, and PG2 is part of the storage port SP. And the transistors S1 and D1 is part of the match port MP.

Still referring to FIG. 4A, the second SRAM circuit 104b includes pull-up transistors PU3 and PU4; pull-down transistors PD3 and PD4; pass gate transistors PG3 and PG4; data gate transistor D2; and search gate transistor S2. The sources of PU3 and PU4 are coupled together and connected to high voltage Vdd. The sources of PD3 and PD4 are coupled together and connected to low voltage Vss or ground. The gates of PU3 and PD3 are coupled together and connected to the common drains of PU4, PD4 and PG4. The gates of PU4 and PD4 are coupled together and connected to the common drains of PU3, PD3, and PG3. PU3, PU4, PD3, and PD4 forms a second set of cross coupled inverters to store a data bit. The source of PG3 is connected to the same bit line BL and the source of PG2 is connected to the same bit line bar BLB. The gates of PG3 and PG4 are connected to a second word line WL_B. A second output storage node at the common drain between PU4, PD4, and PG4 is coupled to the gate of the data gate transistor D2. The source of D2 is connected to the same match line ML and the drain of D2 is connected to the drain of search gate transistor S2. The gate of S2 is connected to a search line bar SLB and the source of S2 is connected to low voltage Vss or ground. For the second SRAM circuit 104b, the transistors PU3, PU4, PD3, PD4, PG3, and PG4 is part of the storage port SP. And the transistors S2 and D2 is part of the match port MP.

Figure 4B:
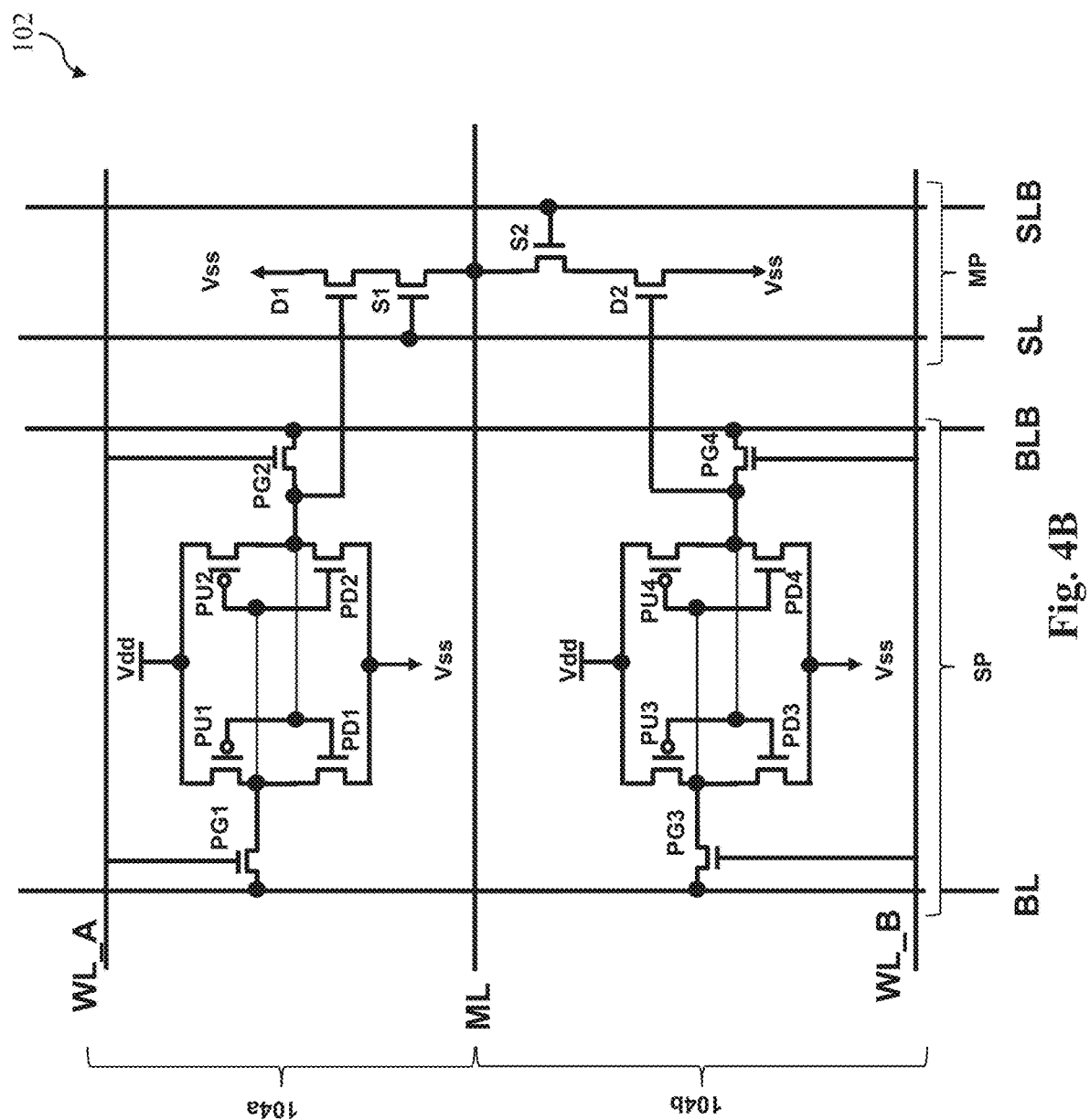
FIG. 4B is a circuit diagram of a reverse stack TCAM cell according to an embodiment of the present disclosure.

FIG. 4B is a circuit diagram of a reverse stack TCAM cell 102 according to an embodiment of the present disclosure. The reverse stack TCAM cell 102 uses regular SRAM circuit architectures and resembles the regular stack TCAM cell 102 of FIG. 4A. For the sake of brevity, similar configurations and connections will not be recited again. One difference in the reverse stack type is that the position between D1 and S1 is flipped, and the position of S2 and D2 is flipped. Specifically, the source of D1 and D2 is now connected to low voltage Vss or ground. And the source of S1 and S2 is now connected to the match line ML.

As shown in the circuit diagrams of FIGS. 4A and 4B, certain transistors are n-type field effect transistors (NFETs), and others are p-type field effect transistors (PFETs). The present disclosure is not limited to the present configurations of NFETs and PFETs, and other combinations of NFETs and PFETs may be possible. The transistors may be formed of planar metal oxide field effect transistors (MOSFETs), fin field effect transistors (finFETs), or gate all around (GAA) transistors.

Figure 5A:
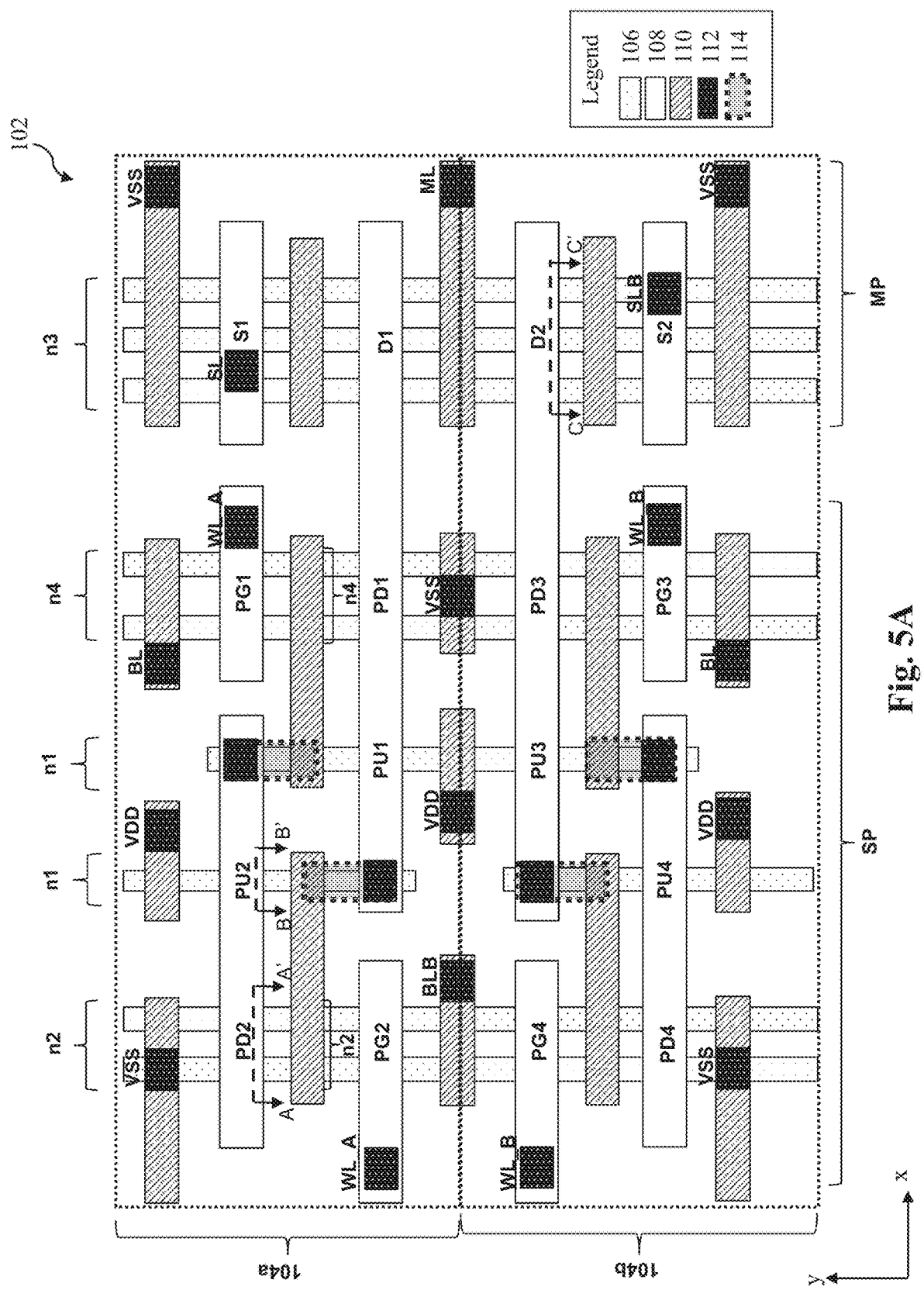
FIG. 5A is an example cell layout for the cell in FIG. 4A according to an embodiment of the present disclosure.

FIG. 5A is an example cell layout for the cell in FIG. 4A according to an embodiment of the present disclosure. The embodiment shows fin semiconductor structures, but other semiconductor structures are also possible. The TCAM cell layout 102 includes two SRAM cells 104a and 104b defined by the dashed line cell boundaries. The TCAM cell 102 includes several fins 106 that extend in the y direction. As shown, many of the fins are shared between the two SRAM cells 104a and 104b. Several gates 108 are disposed over the fins 106 extending in the x direction, some of which extend across the SP and MP regions. In some embodiments, one gate from each SRAM cells 104a and 104b may span continuously across both SP and MP regions. Several source/drain (S/D) contacts 110 may couple S/D regions of the same or different transistors together. Several vias 112 may either connect to gates 108 or S/D contacts 110. The vias 112 allow electrical connection from the gates 108 or S/D contacts 110 to a higher material layer in a vertical direction. There are also 4 gate-to-drain contacts 114 that couple gates 108 to S/D contacts 110. Contacts 114 are also referred to as butt contacts. In one embodiment, the interconnection between the drain (or source) to the gate is achieved by a local interconnect (LI) technology. For example, the local interconnect is formed using the gate electrode material, such as polysilicon, metal, or other conductive material used in gate electrode. In this situation, the polysilicon (metal, or other conductive material) is used not only to form gate electrode but also to form interconnect. More particularly, the gate electrode is extended to the targeted drain (or source) region and directly lands on the silicon substrate within the targeted drain region. In other example, the butt contacts are elongated contacts oriented in Y-direction and are formed simultaneously with other contacts (such as long contacts) in a same procedure that includes dielectric deposition, patterning and metal deposition.

FIG. 5A shows where each of the transistors PU1, PU2, PU3, PU4, PD1, PD2, PD3, PD4, PG1, PG2, PG3, PG4, D1, D2, S1, and S2 are located (labeled on the gate of each transistor). How each transistor is connected to each other has already been described with respect to FIG. 4A and will not be repeated here for the sake of brevity.

Still referring to FIG. 5A, the SP portion and the MP portion are configured such that the channel widths of corresponding transistors are different in order to tune various circuit parameters including cell stability, sink current, and access speed. This can be achieved through various embodiments. In the embodiment shown in FIG. 5A, fin active regions are employed. Various transistors, such as a pull-up transistor, a pull-down transistor, a pass-gate transistor, a data gate transistor, and a search gate transistor are formed on a particular number of fin active regions, respectively. Particularly, a pull-up transistor engages n1 of fins 106, a pull-down transistor engages n2 of fins 106, a data gate transistor engages n3 of fins 106, and a search gate transistor engages n3 of fins 106. Furthermore, a pass-gate transistor may engage n4 of fins 106 that have the same or different number of fins as n2. The parameters n1, n2, n3 and n4 are integers, such as, 1, 2, 3, etc. In one example, the n2 configuration includes 2 fins for the pulldown transistors PD1, PD2, PD3, and PD4 and the n1 configuration includes 1 fin for the pullup transistors PU1, PU2, PU3, and PU4. In the present embodiment, the n4 configuration is the same as the n2 configuration, where the n4 configuration also includes 2 fins for the pass gate transistors PG1, PG2, PG3, and PG4. However, in alternative embodiments, n4 may be different than n2 depending on design characteristics. The n3 configuration includes 3 fins for the search gate and data gate transistors D1, D2, S1, and S2. Note that in some embodiments, the n2 configuration may include less or more fins such as 1 or 3. And in further embodiments, the n3 configuration may include less or more fins such as 2 or 4. Furthermore, in alternative embodiments, a multiple channel structure, such as a gate all around (GAA) structure, is employed. In this case, the channel widths are tuned differently, such as described in FIG. 6.

Still referring to FIG. 5A, vias WL_A, WL_B, VSS, BLB, VDD, BL, SL, and SLB are connected to either the gates 108 or S/D contacts 110. Each of the vias correspond and connect to the respective underlying WL_A, WL_B, Vss, BLB, Vdd, BL, SL, and SLB as shown in FIG. 4A. Due to spacing and configuration, there may be multiple vias in the TCAM cell 102 that correspond to the same connection. Note that the via ML and the vias VSS in SRAMs 104a and 104b are positioned close to or at the right cell boundary along the y direction. These vias are separated from each other and substantially aligned along the y direction.

Figure 5B:
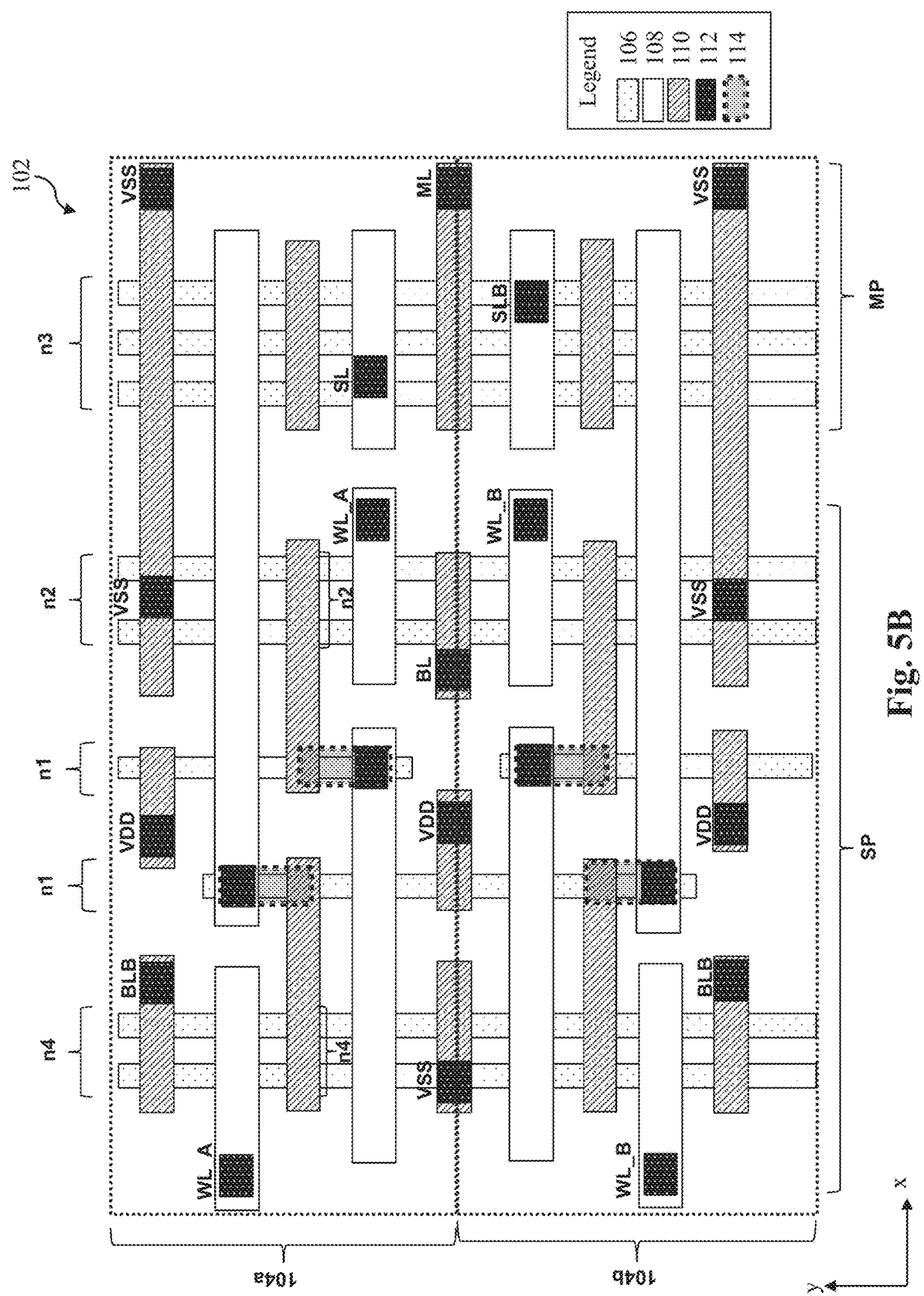
FIG. 5B is an example cell layout for the cell in FIG. 4B according to an embodiment of the present disclosure.

FIG. 5B is an example cell layout for the cell in FIG. 4B according to an embodiment of the present disclosure. As described above, the cell 102 in FIG. 4B is a reverse stack TCAM cell. FIG. 5B shows fin semiconductor structures, but other semiconductor structures are also possible. The reverse TCAM cell layout 102 includes two SRAM cells 104a and 104b defined by the dashed line cell boundaries. The reverse TCAM cell 102 includes several fins 106 that extend in the y direction. As shown, many of the fins are shared between the two SRAM cells 104. Several gates 108 are disposed over the fins 106 extending in the x direction. Several source/drain (S/D) contacts 110 may couple S/D regions of the same or different transistors together. Several vias 112 may either connect to gates 108 or S/D contacts 110. The vias 112 allow electrical connection from the gates 108 or S/D contacts 110 to a higher material layer in a vertical direction. There are also 4 gate-to-drain contacts 114 that couple gates 108 to S/D contacts 110. How each transistor is connected to each other has already been described with respect to FIG. 4B and will not be repeated here for the sake of brevity. The fins 106 in FIG. 5B may also have n1, n2, n3, and n4 configurations, which are like the n1, n2, n3, and n4 configurations in FIG. 5A.

Still referring to FIG. 5B, vias WL_A, WL_B, VSS, BLB, VDD, BL, SL, and SLB are connected to either the gates 108 or S/D contacts 110. Each of the vias correspond and connect to the respective underlying WL_A, WL_B, Vss, BLB, Vdd, BL, SL, and SLB as shown in FIG. 4B. Due to spacing and configuration, there may be multiple vias in the TCAM cell 102 that correspond to the same connection. Note that the via ML and the vias VSS in SRAMs 104a and 104b are positioned close to or at the right cell boundary along the y direction. These vias are separated from each other and substantially aligned along the y direction.

FIG. 6 is a cross-sectional view of the TCAM cell in FIG. 5A cut along the lines A-A', B-B', and C-C'. The cut along A-A' is shown at the top figure of 6A, which corresponds to the n2 configuration. As shown, there are 2 fins 606 that protrude from a semiconductor substrate 602. Each of the fins are insulated from each other by a dielectric material 610. The sidewalls and top portions of the protruded fins 606 are covered and surrounded by a gate material 608. However, as described above with respect to FIG. 5A, the channel widths may also be tuned differently for various transistors in a multiple channel vertically stacked structure, such as through a gate all around (GAA) structure. For example, in an alternative embodiment, the n2 configuration of 6A may also be realized through a GAA structure shown in the bottom figure of 6A. As shown in the bottom figure of 6A, there are several semiconductor layers 616 that are wrapped around by a gate material 608. The semiconductor layers 616 are disposed over a semiconductor substrate 602. A portion of the semiconductor substrate 602 is insulated from the gate material 608 by a dielectric material 610. In this embodiment, there are 4 semiconductor layers, which corresponds to double the number of fins 606 in the top figure of 6A.

In similar fashion, the cut along B-B' is shown at the top figure of 6B and the cut along C-C' is shown at the top figure of 6C. The cut along B-B' corresponds to the n1 configuration and the cut along C-C' corresponds to the n3 configuration. The n1 and n3 configurations in 6B and 6C are analogous to the n2 configuration in 6A described above. The difference is that the n1 configuration shows 1 fin and may correspond to two semiconductor layers in the GAA structure. And the n2 configuration shows 3 fins and may correspond to 6 semiconductor layers in the GAA structure. For example, for equivalent operation, the number of semiconductor layers in a GAA structure may double the number of fins in a finFET structure. Other proportions are possible for a target performance. Further, hybrid structures within one TCAM cell is possible, where certain structures are finFET structure and certain structures are GAA structures.

Figure 7:
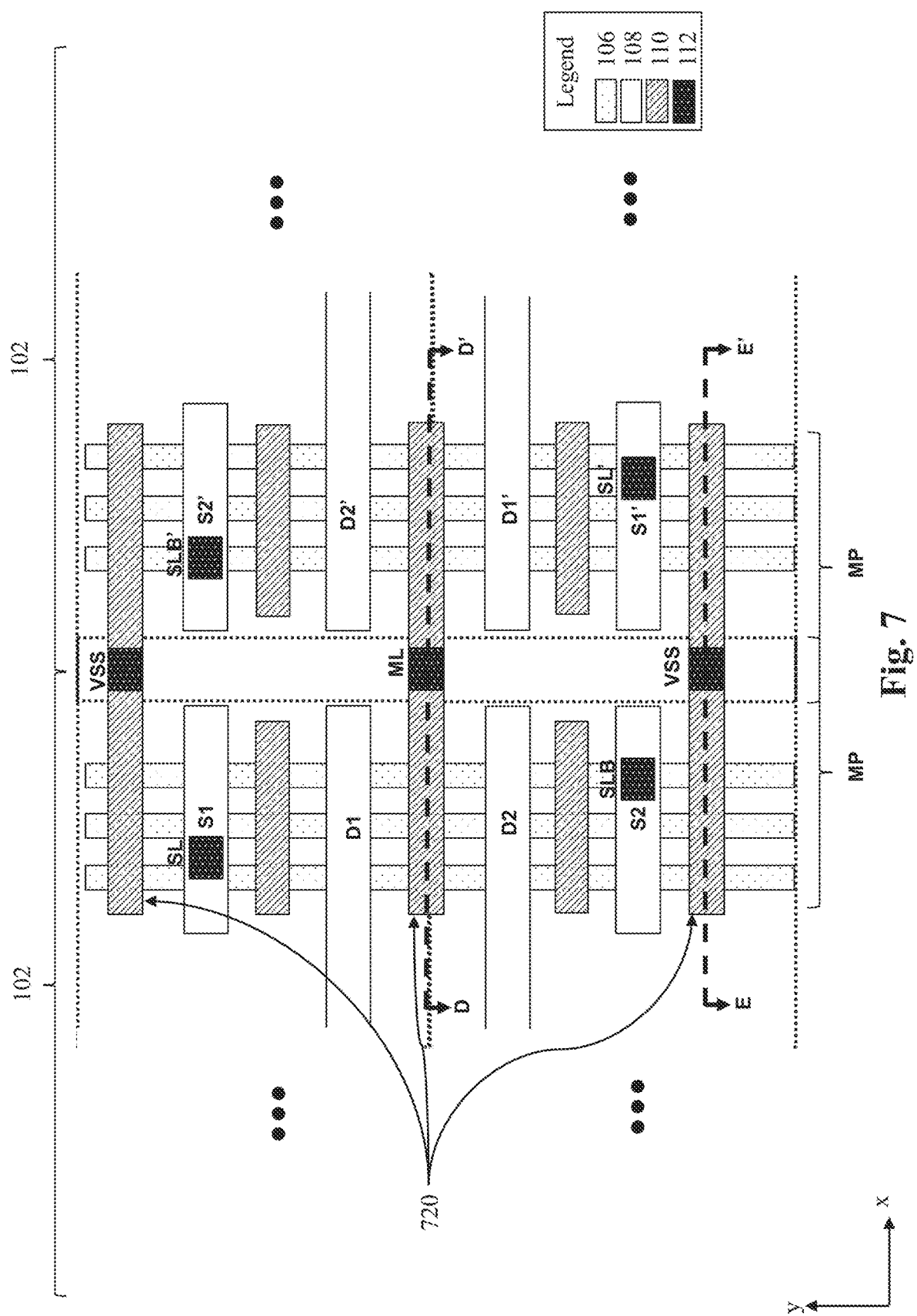
FIG. 7 is an example layout at a TCAM cell boundary taken between two adjacent TCAM cells according to an embodiment of the present disclosure.

FIG. 7 is an example layout centered at a TCAM cell boundary taken between two adjacent TCAM cells 102 according to an embodiment of the present disclosure. The two TCAM cells 102 may be two regular stack TCAM cells depicted in FIG. 5A. Alternatively, they may be two reverse stack TCAM cells depicted in FIG. 5B. In either case, the two TCAM cells mirror each other such that their respective match port portions MP are positioned adjacent to each other by a shared cell boundary that runs in the y direction. As shown, there is an overlapped MP portion between the two adjacent TCAM cells 102. This overlap reduces feature size for area reduction benefits. In the overlapped MP portion, the two TCAM cells 102 may share the same vias VSS and ML. The shared vias VSS and ML may land on top of shared S/D contacts 720. The shared S/D contacts 720 may span across the shared cell boundary that runs in the y direction, thereby connecting the source or drain regions of the transistors between the two cells 102. For example, the shared S/D contacts 720 may land on top of source regions of the transistors S1, S2', D1, D2', D2, D1', S2, and S1'.

FIG. 8A is a cross-sectional view embodiment of the example layout in FIG. 7, cut along the D-D' line. As shown, source/drain (S/D) features 814 formed on fins 816 in a first TCAM cell 102 are coupled to S/D features 814 formed on fins 818 in a second TCAM cell 102 by a shared S/D contact 810. The source/drain features 814 may be source or drain features of the transistors in the MP portion of each respective TCAM cells 102. As shown, the source or drain features are disposed atop the tip of each of the fins 816 and 818. These S/D features may be epitaxially grown so that they do not directly contact each other. Rather, they make a common connection through the S/D contact 810. The S/D contact 810 spans across the cell boundary between the two TCAM cells. A shared via 812 is disposed atop the shared S/D contact 810 at the cell boundary. The via 812 is used to connect the S/D contact 810 to a higher metal layer such as metal layer M1 depicted by a dashed box above the via 812.

Figure 8B:
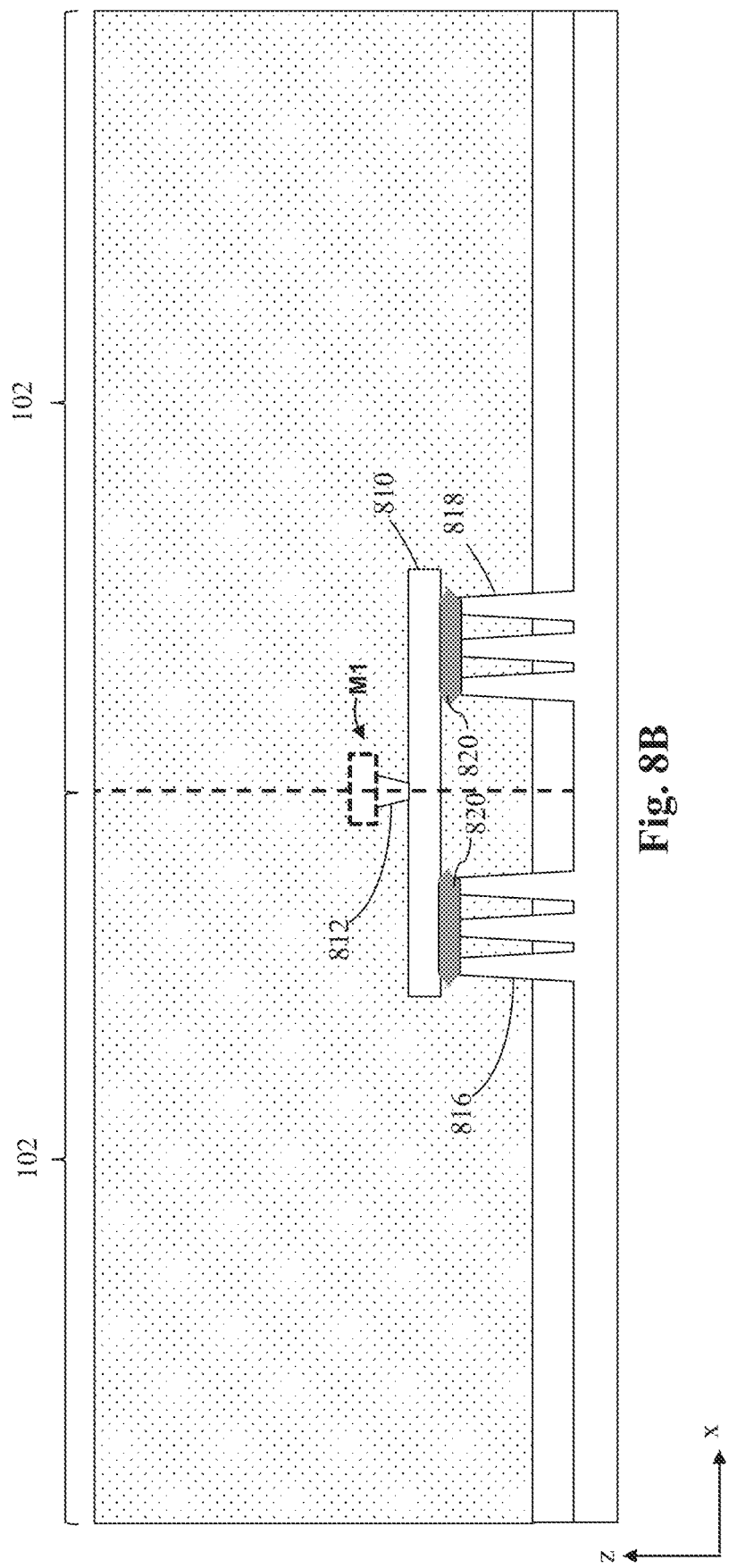

FIG. 8B is another cross-sectional view embodiment of the example layout in FIG. 7, cut along the D-D' line. FIG. 8B is similar to FIG. 8A, except that S/D features 820 atop the tip of each of the fins 816 are merged and S/D features 820 atop the tip of each of the fins 818 are merged. For example, the source or drain regions in fins 816 may share a merged common source, and the S/D contact 810 makes direct contact with the merged common source.

Figure 9:
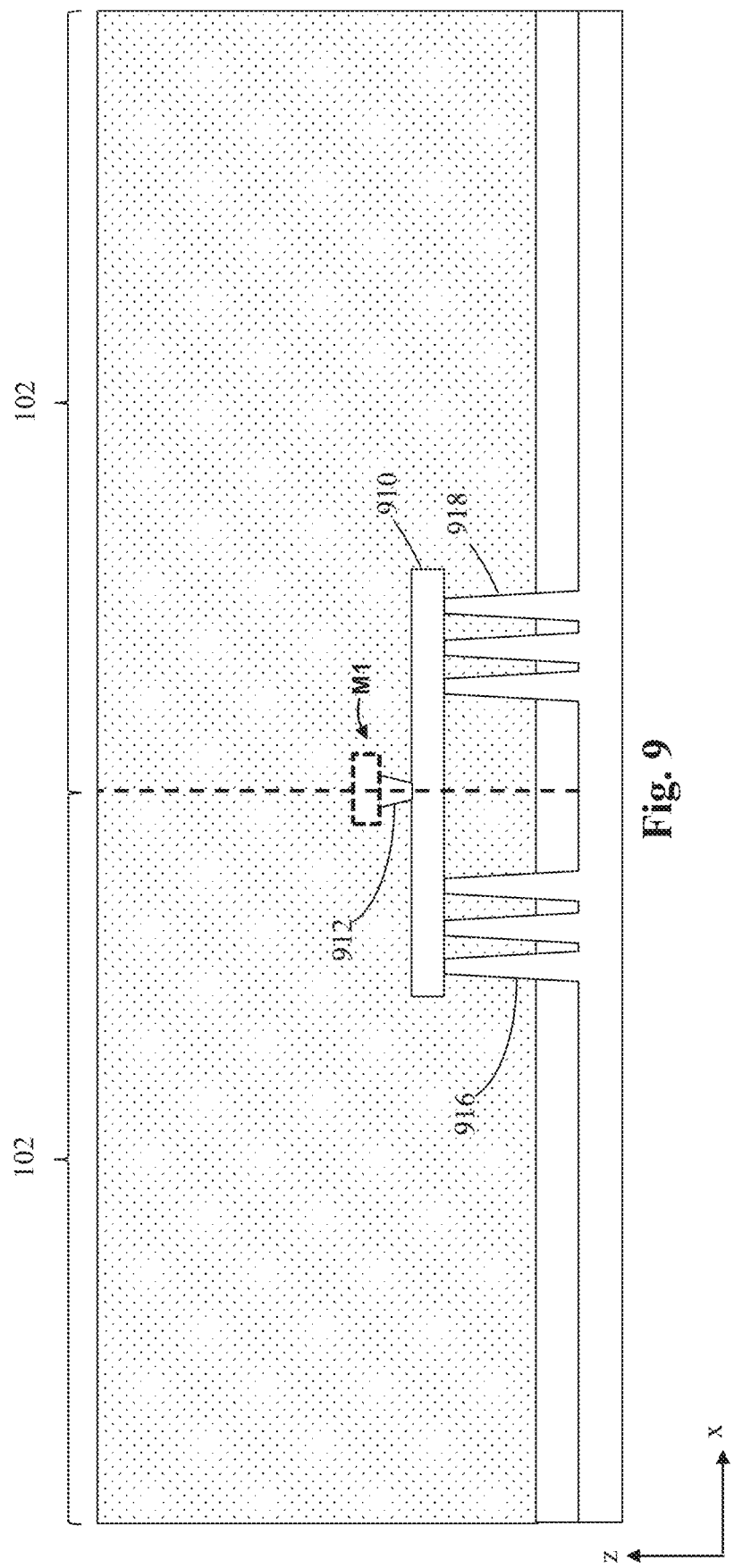
FIG. 9 is a cross-sectional view of the example layout in FIG. 7 cut along the E-E' line.

FIG. 9 is a cross-sectional view of the example layout in FIG. 7, cut along the E-E' line. As shown, fins 916 in a first TCAM cell 102 is coupled to fins 918 in a second TCAM cell 102 by a shared S/D contact 910. The fins 916 and fins 918 may be source or drain regions of the transistors in the MP portion of each respective TCAM cells 102. The source or drain regions may have source or drain features disposed atop the tip of each of the fins 916 and 918 (not shown). Similar to FIGS. 8A and 8B, the source or drain features may or may not merge together. The S/D contact 910 spans across the cell boundary between the two TCAM cells. A shared via 912 is disposed atop the shared S/D contact 910 at the cell boundary. The via 912 is used to connect the S/D contact 910 to a higher metal layer such as metal layer M1 depicted by a dashed box above the via 912.

Figure 10A:
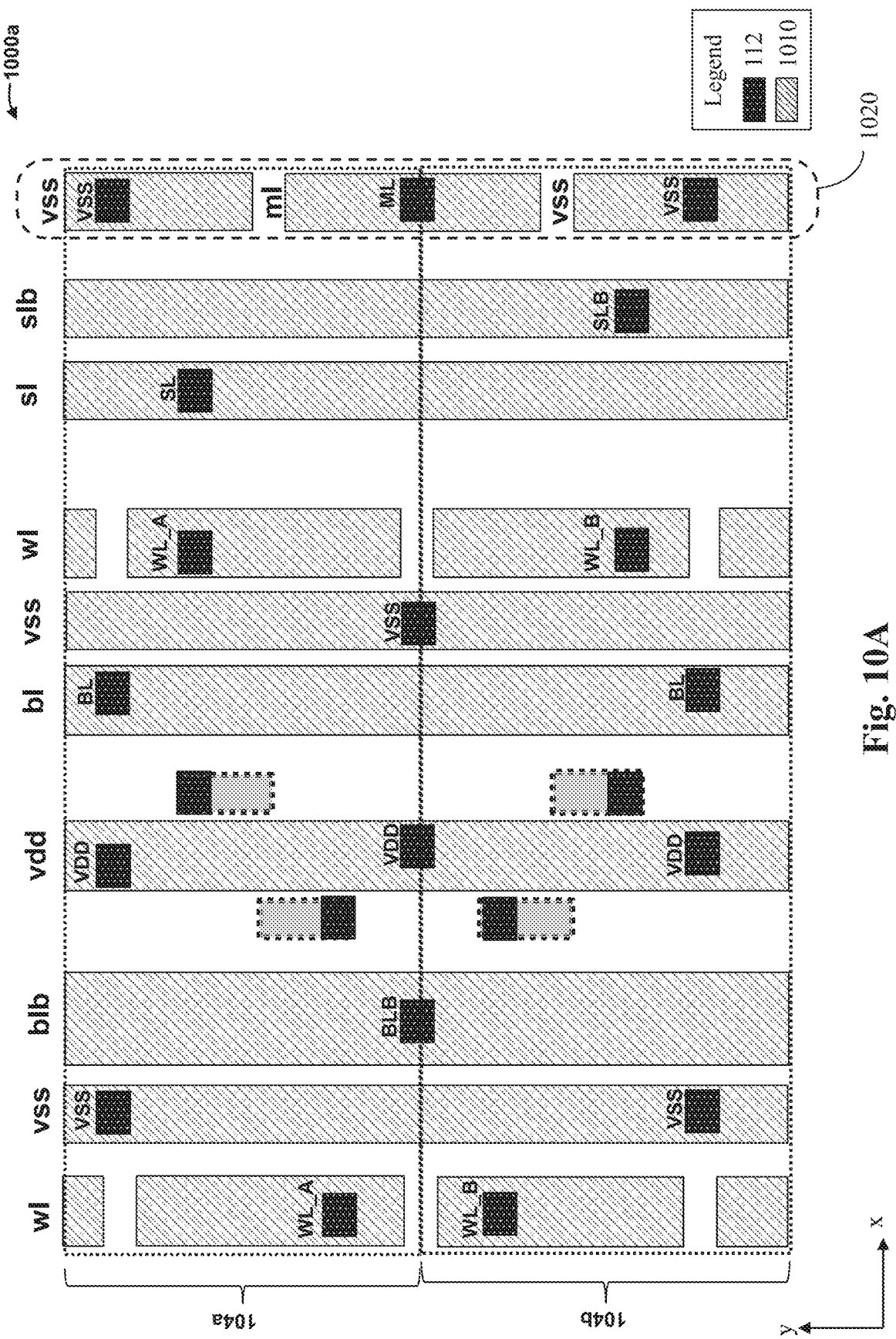
FIG. 10A is an example first metal layer layout on top of the cell layout in FIG. 5A according to an embodiment of the present disclosure.

FIG. 10A is an example first metal layer (M1) layout 1000a on top of the cell layout in FIG. 5A according to an embodiment of the present disclosure. The via connections 112 are the same via connections 112 in FIG. 5A. These via connections connect the S/D contacts 110 or gates 108 in FIG. 5A to the first metal lines 1010 in FIG. 10A. The depicted first metal lines 1010 extends along the y direction and may connect to multiple vias of the same type. Some of the first metal lines 1010 may extend across cell boundaries of the SRAM cells 104. For example, a vss first metal line may have two VSS vias connected to it, each VSS via being in different SRAM cells 104. Some of the first metal lines 1010 may also be of the same type. For example, there are multiple w1, vss, and vdd first metal lines that connect to the respective WL_A, WL_B, VSS, and VDD vias. For the w1 first metal lines depicted in FIG. 10A, there are metal line cuts that isolate the WL_A vias from the WL_B vias so that they are not on the same metal strip. In the M1 layout 1000a, there is a cell edge region 1020 that includes two vss first metal lines and one m1 first metal line. Each of these metal lines are separated from each other by a metal line cut. The vss first metal lines are connected to VSS vias and the m1 first metal line is connected to a ML via. In some embodiments, the metal lines in the cell edge region 1020 were first formed by a single extended metal line. Subsequently, the single metal line was cut to form 3 separate metal lines that align in the y direction.

Figure 10B:
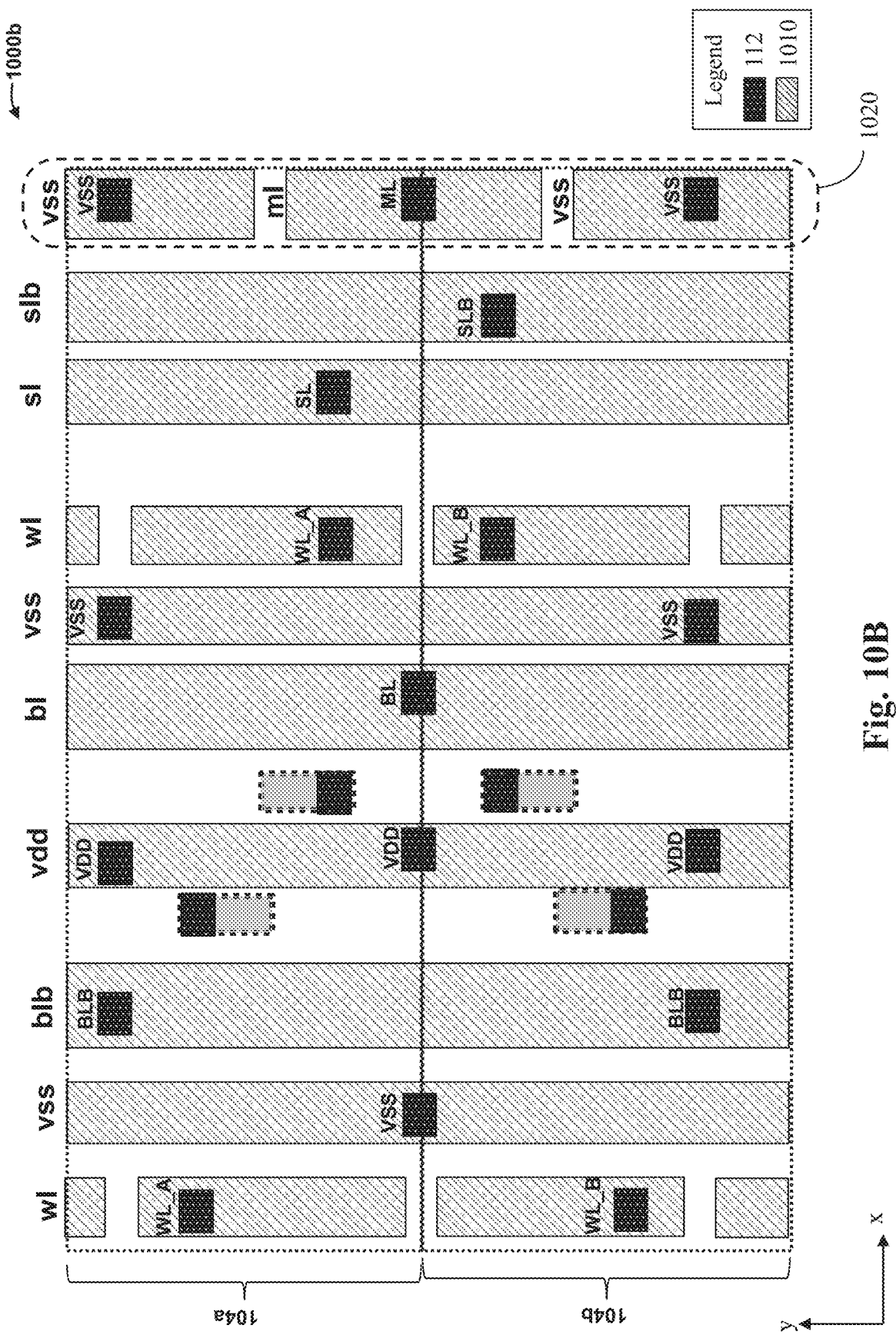
FIG. 10B is an example first metal layer layout on top of the cell layout in FIG. 5B according to an embodiment of the present disclosure.

FIG. 10B is an example first metal layer (M1) layout 1000b on top of the cell layout in FIG. 5B according to an embodiment of the present disclosure. The via connections 112 are the same via connections 112 in FIG. 5B. These via connections connect the S/D contacts 110 or gates 108 in FIG. 5B to the first metal lines 1010 in FIG. 10B. The depicted first metal lines 1010 extends along the y direction and may connect to multiple vias of the same type. Some of the first metal lines 1010 may extend across cell boundaries of the SRAM cells 104. For example, a blb first metal line may have two BLB vias connected to it, each VSS via being in different SRAM cells 104. Some of the first metal lines 1010 may also be of the same type. For example, there are multiple w1, vss, and vdd first metal lines that connect to the respective WL_A, WL_B, VSS, and VDD vias. For the w1 first metal lines depicted in FIG. 10A, there are metal line cuts that isolate the WL_A vias from the WL_B vias so that they are not on the same metal strip. In the M1 layout 1000b, there is a cell edge region 1020 that includes two vss first metal lines and one m1 first metal line. Each of these metal lines are separated from each other by a metal line cut. The vss first metal lines are connected to VSS vias and the m1 first metal line is connected to a ML via. In some embodiments, the metal lines in the cell edge region 1020 were first formed by a single extended metal line. Subsequently, the single metal line was cut to form 3 separate metal lines that align in the y direction.

Figure 11:
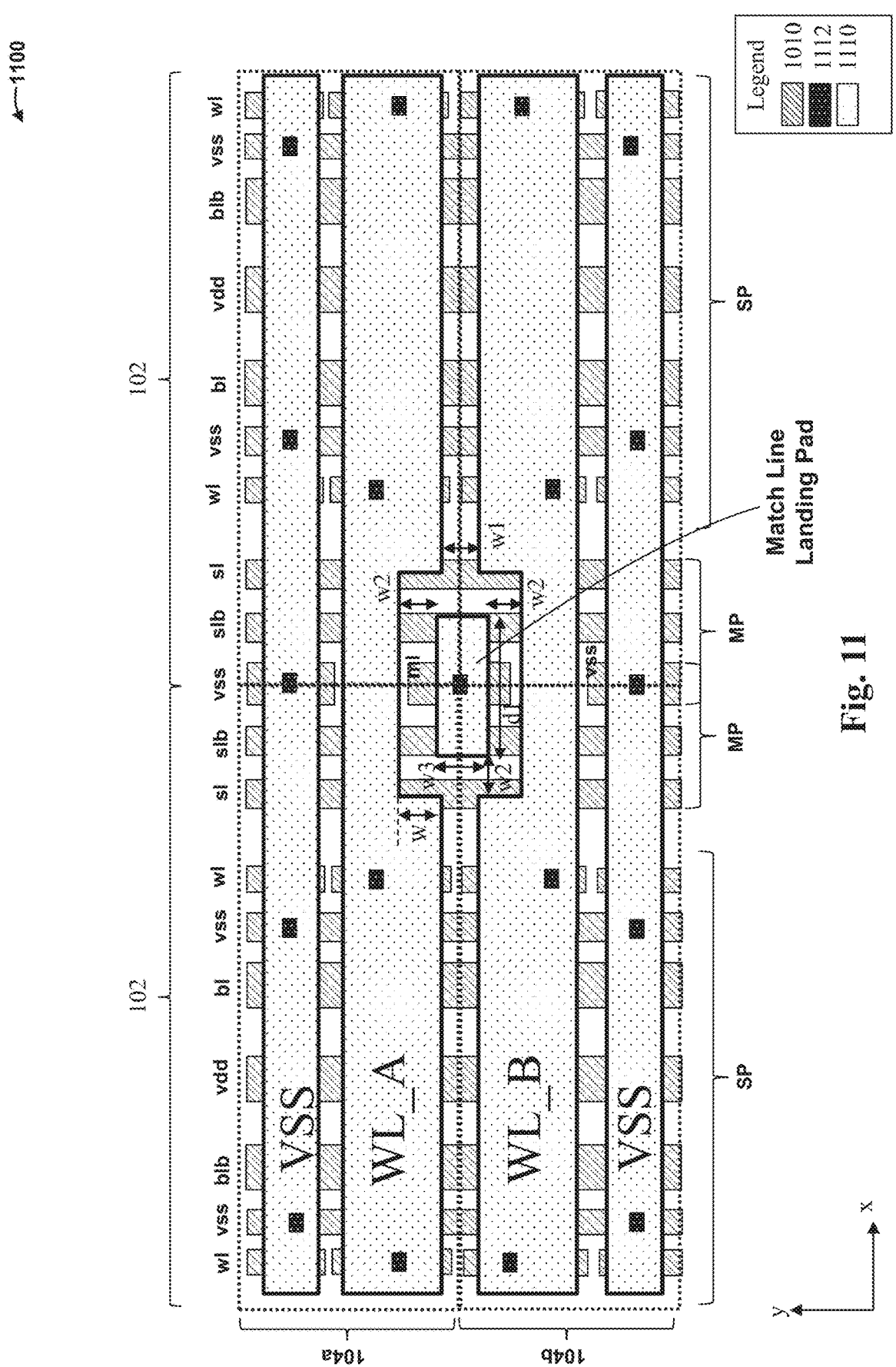
FIG. 11 is an example second metal layer layout on top of the first metal layer layout of FIG. 10A or FIG. 10B taken across two adjacent TCAM cells.

FIG. 11 is an example second metal layer (M2) layout 1100 on top of the first metal layer layout (M1) of FIG. 10A or FIG. 10B taken across two adjacent TCAM cells 102. The two TCAM cells mirror each other such that their respective match port portions MP are positioned adjacent to each other by a shared cell boundary that runs in the y direction. As shown, there is an overlapped MP portion between the two adjacent TCAM cells 102. This overlapped MP portion may correspond to the cell edge region 1020 of FIG. 10A or 10B. The first metal lines 1010 are the same first metal lines 1010 in FIG. 10A or 10B. As shown, some of these first metal lines 1010 may be connected to second metal lines 1110 through vias 1112. The second metal lines 1110 extends across the two TCAM cells 102 in the x direction perpendicular to the first metal lines 1010. The second metal lines 1110 may include VSS, WL_A, and WL_B second metal lines. There may be multiple VSS second metal lines, each connected to an underlying Vss contact of different regions in a TCAM cell. Each second metal lines 1110 may connect to multiple vias 1112 along the x direction. The number of vias 1112 that connects between the first metal lines 1010 and second metal lines 1110 may be the same as the number of vias 112 that connects between the S/D contacts 110 or gates 108 to the first metal lines 1010 (See FIGS. 10A and 10B). However, for some first metal lines, there may be more vias 1112 than vias 112. For example, for a given vss metal line 1010, there may be one vss via 112 and two vss vias 1112.

Still referring to FIG. 11, the second metal lines 1110 further includes a match line landing pad. The match line landing pad connects to the m1 first metal line through a via 1112. The match line landing pad may be positioned to overlap boundaries between TCAM cells 102 in the x direction and boundaries between SRAM cells in the y direction. The match line landing pad has a length d1 in the x direction that is less than the length of the second metal lines VSS, WL_A, and WL_B in the x direction. In some embodiments the length of d1 may only span across the width of 3 to 4 first metal lines in the x direction. The match line landing pad has a width w3 in the y direction. The width w3 is comparable to the widths of the other second metal lines 1110 in the y direction. The width w3 is large enough to allow further vias to connect to it into a higher metal layer.

Still referring to FIG. 11, the match line landing pad may be sandwiched between and surrounded by other second metal lines 1110. For example, the match line landing pad may be surrounded and positioned between the second metal lines WL_A and WL_B. Each of the second metal lines WL_A and WL_B may have a portion of their metal line recessed with a dent to accommodate for adequate spacing when they surround the match line landing pad. To avoid undesirable shorting and coupling effects, there needs to be adequate spacing between metal lines. The adequate spacing may be represented by a minimum spacing w1 as shown in FIG. 11. The spacing w1 may be a spacing in the y direction between the two second metal lines WL_A and WL_B at a portion that is not recessed. The spacing w2 represents the spacing in the x or y direction between the second metal lines WL_A and WL_B and the match line landing pad. In cases where the width w3 is the same or larger than the spacing w1, the recess into the second metal lines WL_A and WL_B should at least as deep and as wide as the spacing w1. In some embodiments, w2 is the same as w1. In other embodiments, w2 may be larger than w1. In some embodiments, the dent of corresponding metal lines spans a dimension w. In furtherance of the embodiments, the ratio w/w2 ranges between 0.8 and 1.2.

Figure 12:
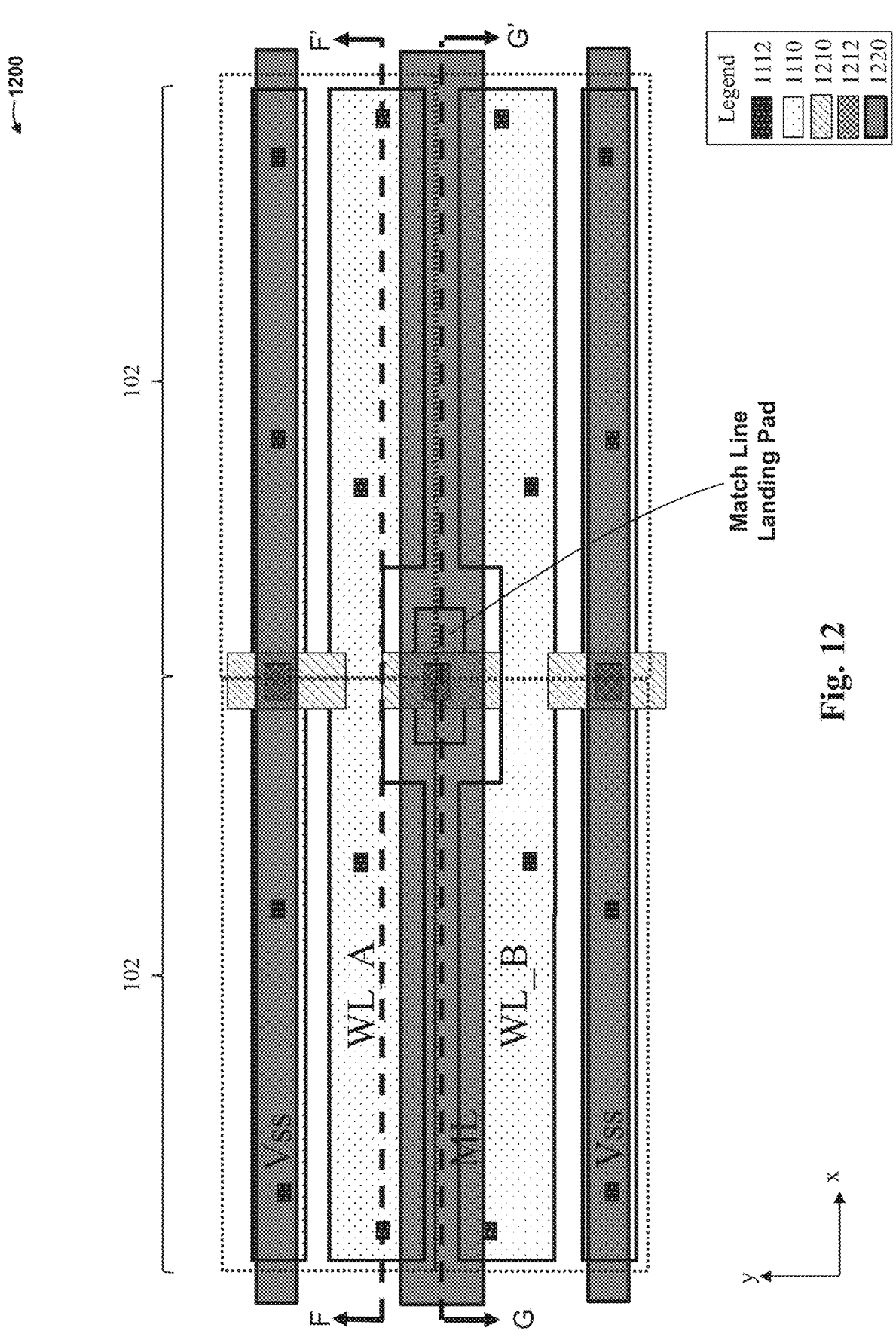
FIG. 12 is an example fourth metal layer layout on top of the second metal layer layout of FIG. 11.

FIG. 12 is an example fourth metal layer (M4) layout 1200 on top of the second metal layer layout of FIG. 11. Although a third metal layer (M3) layout is not explicitly shown, there is a third metal layer (M3) in between the second metal layer (M2) and the fourth metal layer (M4). The vias 1112 are the same vias 1112 in FIG. 11 and the second metal lines 1110 are the same second metal lines 1110 in FIG. 11. As shown, the second metal lines WL_A and WL_B remain at the second metal layer M2, but the second metal lines Vss and the match line landing pad are connected up vertically to the fourth metal layer M4 through vias 1212 and third metal lines 1210. The second metal lines Vss and the match line landing pad are first connected to the third metal lines 1210 through vias (not shown). The third metal lines act as conduits to allow connections to made at the fourth metal layer (M4) through vias 1212. The fourth metal layer (M4) includes fourth metal lines Vss and ML that run in parallel to the second metal lines WL_A and WL_B.

Still referring to FIG. 12, the fourth metal lines Vss and ML extend across the two TCAM cells 102 along the x direction. As shown, the second metal lines WL_A and WL_B are at a different metal layer than the fourth metal line ML. The second metal lines WL_A and WL_B may correspond to word lines that run across a TCAM array such as the TCAM array 100 in FIG. 2. And the fourth metal line ML may correspond to a match line that run across a TCAM array such as the same TCAM array 100 in FIG. 2. That is, the word lines and match lines in the TCAM array 100 may run in parallel along the x direction, where the word lines and match lines are in different metal layers. For example, the word lines are in a second metal layer and the match lines are in a fourth metal layer. Such configuration allows for reduced area benefits as to not crowd the word lines and match lines together in a same metal layer. As such, the fourth metal line ML may have a portion that overlaps with the second metal lines WL_A and WL_B when seen from a top view. The fourth metal line ML has a longer length in the x direction than the match line landing pad that is in the second metal layer (M2).

Although not explicitly shown, periphery circuits may connect to the TCAM cells and arrays as described above. These connections may be made at different metal layers (M1, M2, M3, or M4). In other words, the metal lines may pin out at different metal layers in order to connect to the other periphery circuits. In some cases, these connections are made at common metal lines that span across TCAM cells and TCAM arrays. For example, these common metal lines may include the metal lines WL_A, WL_B, Vss, and ML as described above in FIG. 12. As such, the word lines of the present disclosure may pin out at a second metal layer, and the match lines may pin out at a fourth metal layer. Similarly, the Vss may also pin out at the fourth metal layer.

Figure 13:
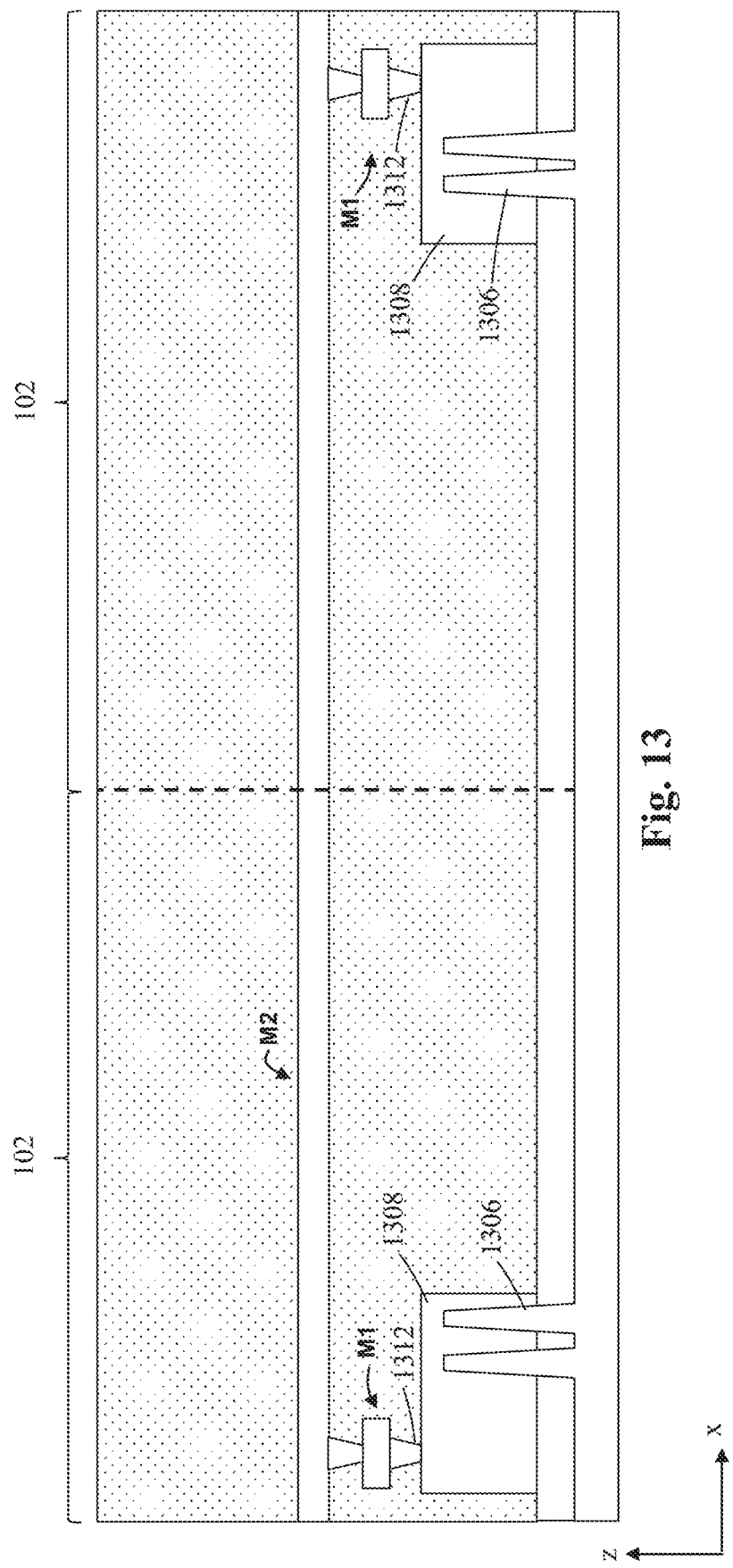
FIG. 13 is a cross-sectional view of the fourth metal layer layout in FIG. 12 cut along the F-F' line.

FIG. 13 is a cross-sectional view of the fourth metal layer layout (M4) in FIG. 12 cut along the F-F' line. Note that the cut is along the second metal line WL_A. The cut passes through the vias 1112 of WL_A. These vias may correspond to the vias 1312 shown in FIG. 13. As shown, fins 1306 in the first and second TCAM cells 102 are each covered and surrounded by a gate 1308. Each of the gate 1308 may correspond to a transistor PG2 of FIG. 5A. The gates 1308 in each TCAM cells 102 are connected to a first metal layer M1 through the vias 1312. Another via connects the respective first metal layer M1 portions to a second metal layer M2. The M1 shown represents a first metal line w1 shown in FIG. 11 and the M2 shown represents the second metal line WL_A shown in FIG. 12. Although not shown, a cut along the second metal line WL_B may show similar features as shown in FIG. 13.

Figure 14:
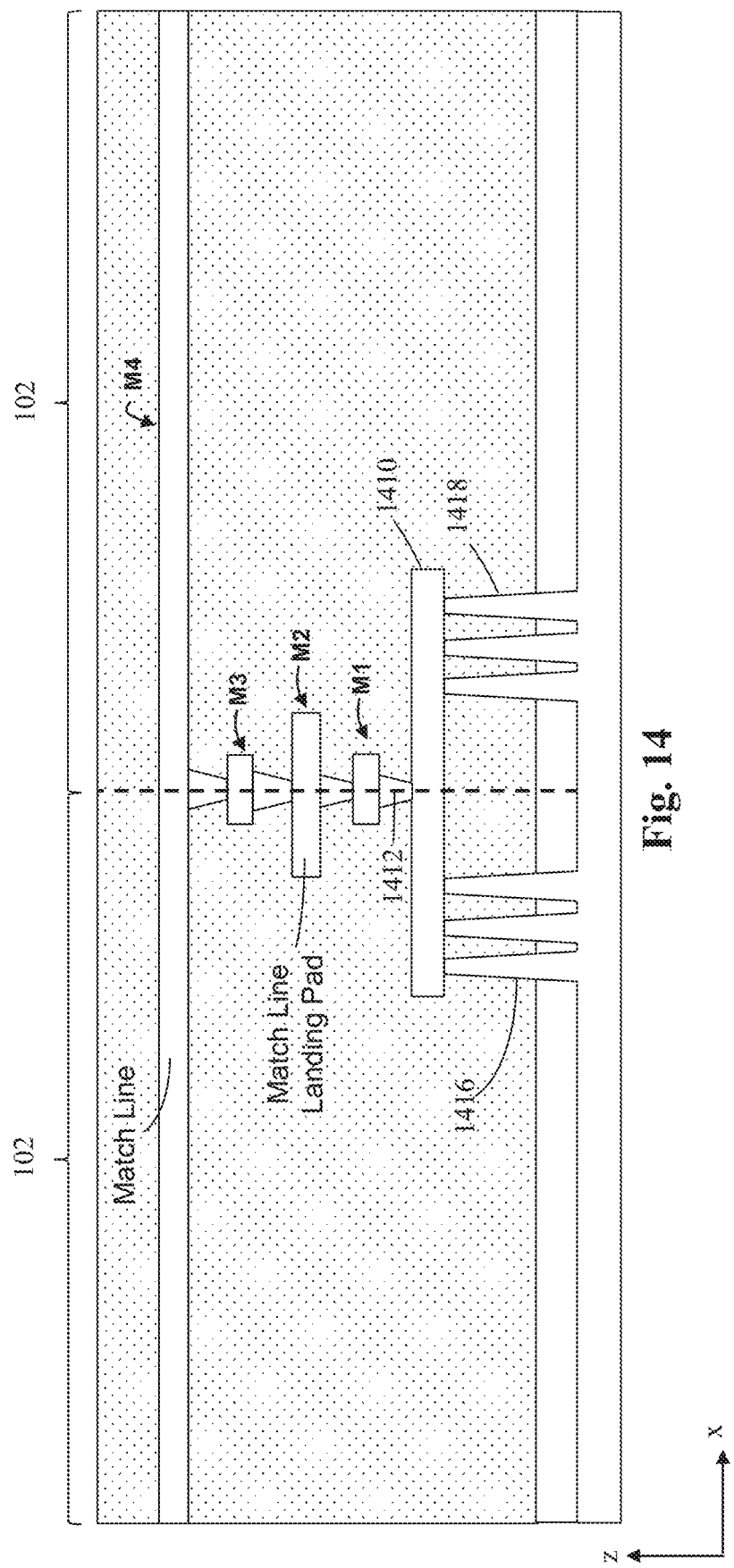
FIG. 14 is a cross-sectional view of the fourth metal layer layout in FIG. 12 cut along the G-G' line.

FIG. 14 is a cross-sectional view of the fourth metal layer layout (M4) in FIG. 12 cut along the G-G' line. Note that the cut is along the fourth metal line ML and passes through the match line landing pad. FIG. 14 is substantially similar to FIGS. 8A and 8B (without showing the source or drain features) because the location of the cross-sectional cut is the same. For example, the fins 1416 may correspond to the fins 816 and the fins 1418 may correspond to the fins 818. The S/D contact 1410 may correspond to the S/D contacts 810. The via 1412 may correspond to the vias 812. The difference in FIG. 14 is that more layers are shown. The additional layers shown are the M1-M4 layers as described above. Each metal layer is connected to each other by a via. As shown, the match line landing pad is in the second metal layer M2 and the match line is in the fourth metal layer M4. The match line is longer than the match line landing pad along the x direction.

Figure 15:
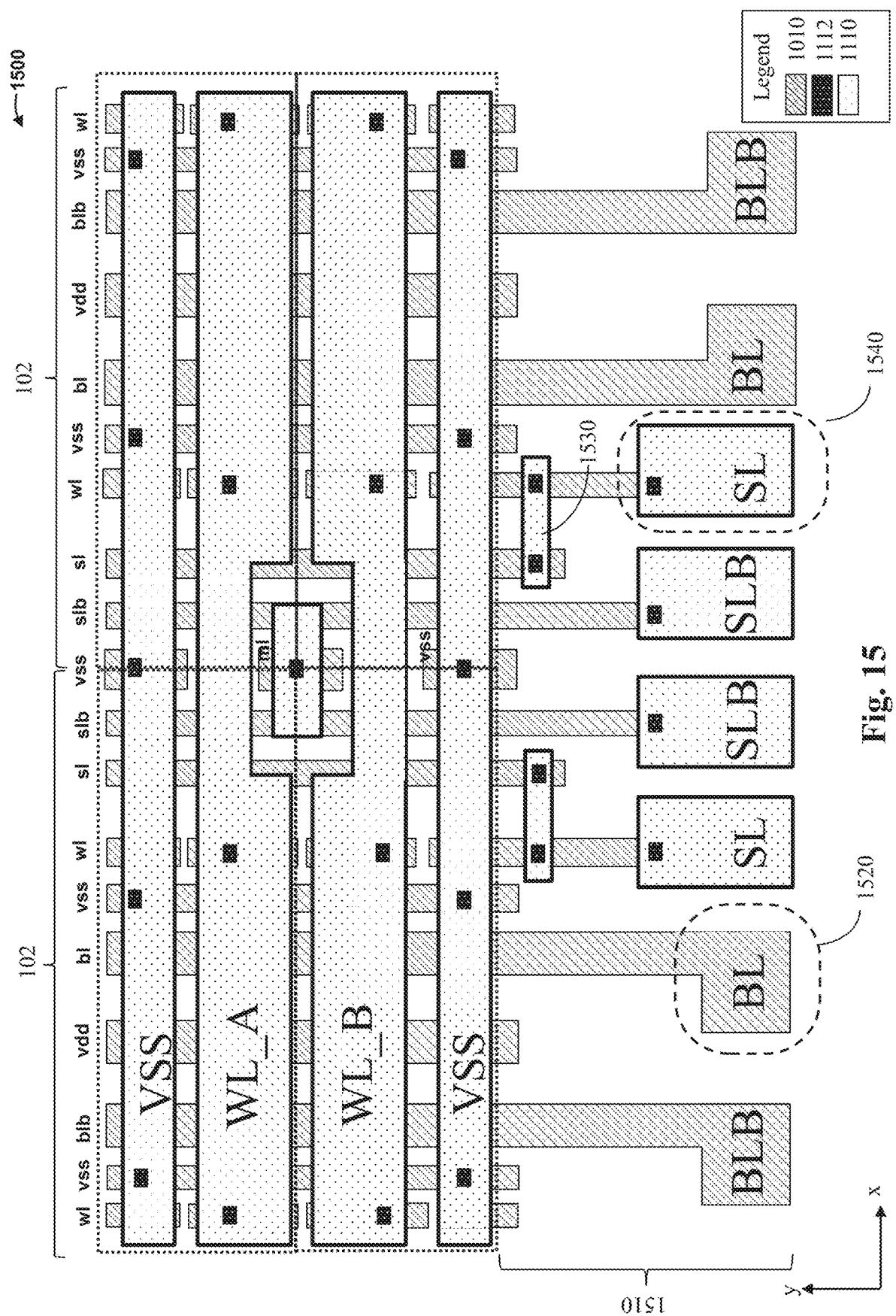
FIG. 15 is an example TCAM array layout taken across two adjacent TCAM cells that shows metal lines extending from the TCAM cells to an outer region.

FIG. 15 is an example TCAM array layout 1500 taken across two adjacent TCAM cells 102 that shows metal lines extending from the TCAM cells to an outer region 1510. The TCAM array layout 1500 shows first metal lines 1010 connected to second metal lines 1110 through vias 1112. The TCAM array layout 1500 resembles the second metal layer (M2) layout shown in FIG. 11. The similar features will not be recited again for the sake of brevity.

Still referring to FIG. 15, the outer region 1510 includes first metal lines 1010 that extend in the y direction from within the TCAM cell boundaries. Some of these first metal lines may connect to each other through a jumper 1530. These first metal lines may include the first metal lines bl, blb, sl, and slb. At one end of each of these first metal lines are respective contact pads BL, BLB, SL, and SLB that allow for additional periphery circuit connections or additional via connections. In other words, each of these metal lines may pin out at the location of each respective contact pads BL, BLB, SL, and SLB.

The BL and BLB contact pads may each be a hammer contact pad 1520. In some embodiments, the hammer contact pad 1520 is an extension to its respective first metal line 1010. For example, the hammer contact pad 1520 is the area where the first metal line has an expanded contact area at one end. In other embodiments, the hammer contact pad 1520 is formed separately and then electrically connected to the respective first metal line. In either case, the hammer contact pad 1520 and its respective first metal line are in the same first metal layer (M1). For example, as shown in FIG. 15, bl and BL, and blb and BLB, are all in the first metal layer M1. As such, the underlying bit lines and bit line bars may pin out at the first metal layer M1.

The SL and SLB contact pads may each be a jumper contact pad 1540. In some embodiments, the jumper contact pad 1540 is connected to its respective first metal line 1010 through a via 1112. In other embodiments, the jumper contact pad 1540 is connected to its respective first metal line 1010 through both a via 1112 and a jumper 1530. The jumper 1530 extends along the x direction and connects two different first metal lines 1010 through vias 1112. The jumper 1530 is used for spacing considerations, so that the SL and SLB contact pads are large enough and also spaced away enough at an adequate distance. In either case, the jumper contact pad 1540 is in the second metal layer (M2) and its respective first metal line is in the first metal layer (M1). For example, as shown in FIG. 15, SL and SLB contact pads are all in the second metal layer M2 and their respective first metal lines sl and slb are all in the first metal layer M1. As such, the underlying search lines and search line bars may pin out at the second metal layer M2.

Still referring to FIG. 15, the contact pads BL, BLB, SL, and SLB all pin out on the same side for ease of connection to periphery circuits. Because the BL/BLB and the SL and SLB contact pads are on different metal layers, spacing demands are alleviated, so that the pin outs can be on the same one side.

Figure 16A:
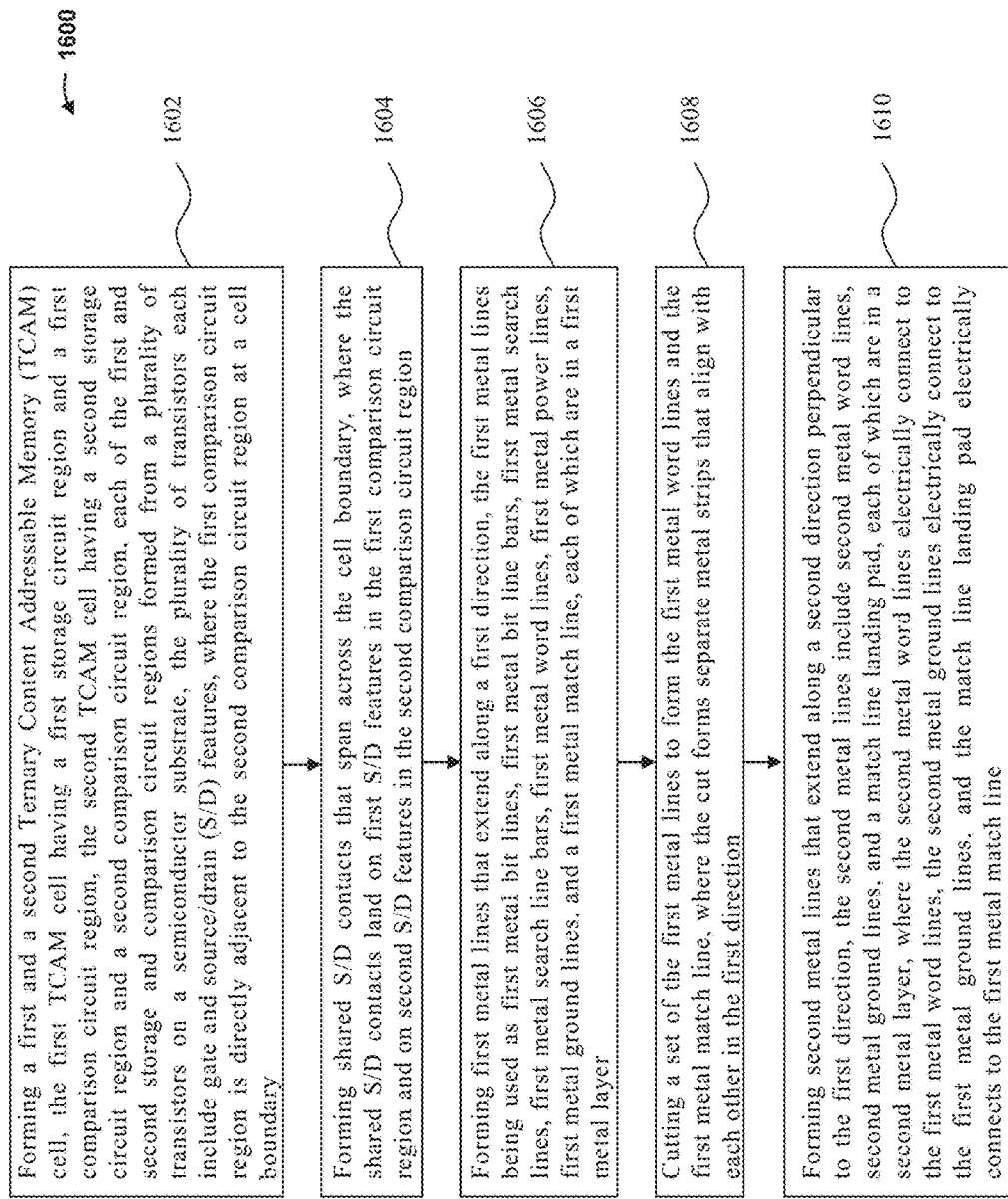
FIGS. 16a and 16b illustrate a flowchart of a method 1600 according to an embodiment of the present disclosure.
Figure 16B:
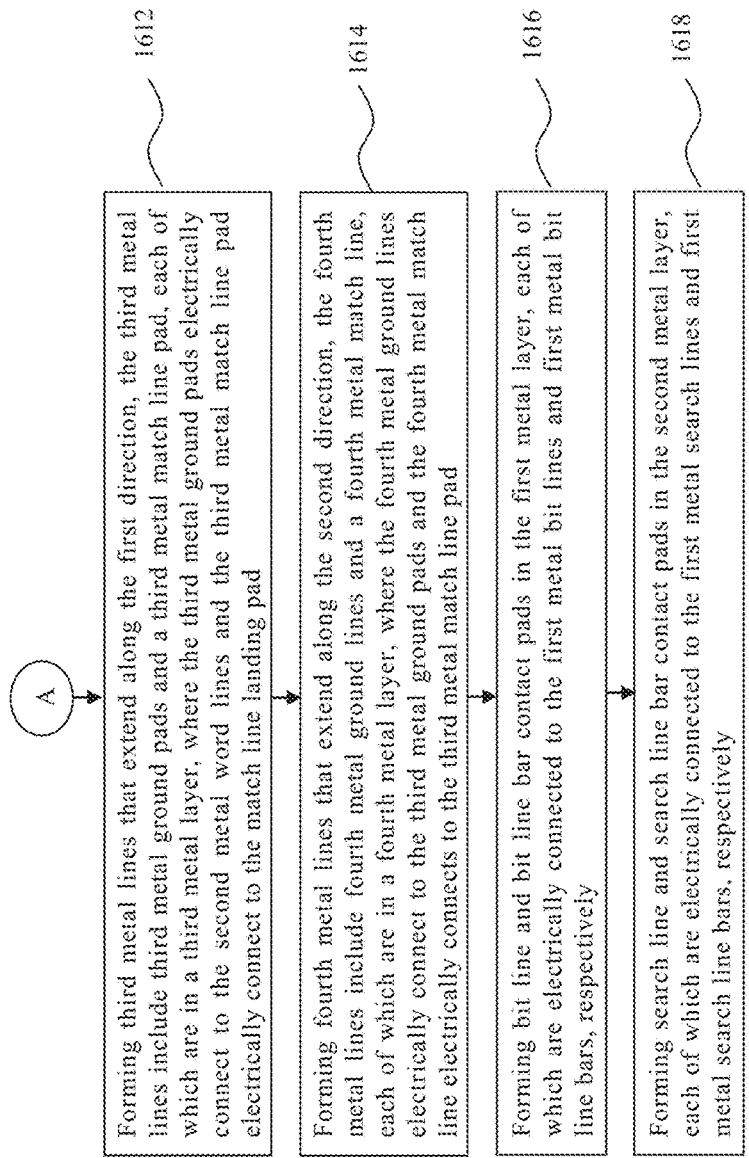

FIGS. 16a and 16b illustrate a flowchart of a method 1600 according to an embodiment of the present disclosure. The method 1600 includes a step 1602 of forming a first and a second Ternary Content Addressable Memory (TCAM) cell, each having a storage circuit region and a comparison circuit region formed from a plurality of transistors on a semiconductor substrate, where the comparison circuit region of each TCAM cell is directly adjacent to each other at a cell boundary. The plurality of transistors each include gate and source/drain (S/D) features.

The method 1600 includes a step 1604 of forming shared S/D contacts that span across the cell boundary between the first and second TCAM cells, where the shared S/D contacts land on first S/D features in the first comparison circuit and on second S/D features in the second comparison circuit region. In other words, the formed source/drain contacts are shared between S/D features of different TCAM cells.

The method 1600 includes a step 1606 of forming first metal lines that extend along a first direction, the first metal lines are used as first metal bit lines, first metal bit line bars, first metal search lines, first metal search line bars, first metal word lines, first metal power lines, first metal ground lines, and a first metal match line, each of which are in a first metal layer. These first metal lines make electrical connection to the gate and S/D features of the plurality of transistors formed on the semiconductor substrate.

The method 1600 includes a step 1608 of cutting a set of the first metal lines to form the first metal word lines and the first metal match line, where the cut forms separate metal strips that align with each other in the first direction.

The method 1600 includes a step 1610 of forming second metal lines that extend along a second direction perpendicular to the first direction, the second metal lines include second metal word lines, second metal ground lines, and a match line landing pad, each of which are in a second metal layer, where the second metal word lines electrically connects to the first metal word lines, the second metal ground lines electrically connect to the first metal ground lines, and the match line landing pad electrically connects to the first metal match line.

The step 1610 may further include forming the second metal word lines to have a recessed portion such that the match line landing pad is formed between the recessed portion of the second metal word lines, and the match line landing pad is shorter than the second metal word lines along the second direction.

The method 1600 includes a step 1612 of forming third metal lines that extend along the first direction, the third metal lines include third metal ground pads and a third metal match line pad, each of which are in a third metal layer, where the third metal ground pads electrically connect to the second metal word lines and the third metal match line pad electrically connects to the match line landing pad.

The method 1600 includes a step 1614 of forming fourth metal lines that extend along the second direction, the fourth metal lines include fourth metal ground lines and a fourth metal match line, each of which are in a fourth metal layer, where the fourth metal ground lines electrically connect to the third metal ground pads and the fourth metal match line electrically connects to the third metal match line pad.

The method 1600 includes a step 1616 of forming bit line and bit line bar contact pads in the first metal layer, each of which are electrically connected to the first metal bit lines and first metal bit line bars, respectively.

The method 1600 includes a step 1618 of forming search line and search line bar contact pads in the second metal layer, each of which are electrically connected to the first metal search lines and first metal search line bars, respectively.

It is understood that additional processes may be performed before, during, or after the steps 1610-1620 of the method 1600. For reasons of simplicity, these additional steps are not discussed herein in detail.

As described by the different embodiments above, the first metal layer may include pinouts for the bit lines and bit line bars connections. The second metal layer may include pinouts for the word lines, search lines, and search line bars connections. The fourth metal layer may include pinouts for the match line and ground (Vss) connections. The third metal layer may be used to simply separate the word line pinouts from the match line pinouts. Pinouts may be contact points where other circuits or external connections to the TCAM cells are made.

The different terms used in the present disclosure are not meant to be limiting. For example, the word metal lines could also mean metal traces or other conductive materials. The word landing pad could also mean a contact pad. A source/drain region, or S/D region may refer to a source or a drain of a device. It may also refer to a region that provides a source and/or drain for multiple devices. Additionally, when referring to a particular line or connection, the general line or connection may be referred to instead of the particular line or connection. For example, when referring to a match line, unless specifically defined otherwise, the match line could be any of or all the metal lines in all the different metal layers that it runs. The same can be said with regards to other connections and lines that run through the different metal layers.

A CAM array using SRAM architectures is disclosed. The CAM array includes different metal lines including word lines, bit lines, search lines, voltage lines, and match lines. Based on the above discussions with respect to a TCAM device, it can be seen that the present disclosure offers advantages over conventional CAM devices. It is understood, however, that other embodiments may offer additional advantages, and not all advantages are necessarily disclosed herein, and that no particular advantage is required for all embodiments. One advantage is that since the same match line is shared between two adjacent memory cells, feature size is reduced, eliminating extra via stacks that otherwise would need to be formed. Another advantage is that since word lines and match lines may be at different metal layers, there is reduced resistive and capacitive coupling effects. Another advantage is that since the search lines and search line bars may be in a different metal layer than in the bit lines and bit line bars, there is enough space to have their pinouts to be on the same side. Additionally, the resistive and capacitive coupling effects are also reduced. These approaches not only conserve chip layout area but increases performance.

One aspect of the present disclosure pertains to a Content Addressable Memory (CAM) array. The CAM array includes a first and a second cell structure. The first and second cell structures share a cell boundary along a first direction. The first cell structure includes a first storage circuit and a first comparator circuit, where the first comparator circuit includes a first transistor having a gate, a drain, and a source, each formed over a substrate. The second cell structure includes a second storage circuit and a second comparator circuit, where the second comparator circuit includes a second transistor having a gate, a drain, and a source, each formed over the substrate. The CAM array further includes a first shared source contact landing on the source of the first transistor and the source of the second transistor. The first shared source contact connects the source of the first transistor to the source of the second transistor. And the first shared source contact extends across the shared cell boundary from the first cell structure to the second cell structure in a second direction perpendicular to the first direction.

Another aspect of the present disclosure pertains to a Ternary Content Addressable Memory (TCAM) array. The TCAM array includes a first TCAM cell and a second TCAM cell over a substrate. The first and second TCAM cells share a cell boundary along a first direction. The TCAM array further includes a plurality of first metal lines over the substrate and extending in the first direction, and one of the first meta lines extends at the cell boundary. The TCAM array further includes a plurality of second metal lines over the plurality of first metal lines and extending in a second direction perpendicular to the first direction. The plurality of second metal lines include a first word line, a second word line, and a match line landing pad. The first and second word lines span across a total length of the first and second TCAM cells and the match line landing pad spans across a partial length of the first and second TCAM cells. The match line landing pad is sandwiched between and surrounded by the first and second word lines such that the match line landing pad is positioned within a recessed portion of the first and second word lines.

Yet another aspect of the present disclosure pertains to a method of forming a Ternary Content Addressable Memory (TCAM) array. The method includes forming a first and a second TCAM cell. The first TCAM cell has a first storage circuit region and a first comparison circuit region. The second TCAM cell has a second storage circuit region and a second comparison circuit region. Each of the first and second storage and comparison circuit regions are formed from a plurality of transistors on a semiconductor substrate. The plurality of transistors each includes gate and source/drain (S/D) features. The first comparison circuit region is directly adjacent to the second comparison circuit region at a cell boundary. The method further includes forming shared S/D contacts that span across the cell boundary. The shared S/D contacts land on first S/D features in the first comparison circuit region and on second S/D features in the second comparison circuit region.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A content addressable memory (CAM) array comprising:
a first cell structure and a second cell structure, the first cell structure having a shared cell boundary with the second cell structure along a first direction,
wherein the first cell structure includes:
a first storage circuit and a first comparator circuit, the first comparator circuit includes a first transistor having a gate, a drain, and a source, each formed over a substrate,
wherein the second cell structure includes:
a second storage circuit and a second comparator circuit, the second comparator circuit having a second transistor having a gate, a drain, and a source, each formed over the substrate; and
a first shared source contact landing on the source of the first transistor and the source of the second transistor, thereby connecting the source of the first transistor to the source of the second transistor, wherein the first shared source contact extends across the shared cell boundary from the first cell structure to the second cell structure in a second direction perpendicular to the first direction.

2. The CAM array of claim 1, further comprising:
a third transistor in the first comparator circuit, the third transistor having a gate, a drain, and a source, each formed over the substrate;
a fourth transistor in the second comparator circuit, the fourth transistor having a gate, a drain, and a source, each formed over the substrate; and
a second shared source contact landing on the source of the third transistor and the source of the fourth transistor, thereby connecting the source of the third transistor to the source of the fourth transistor, wherein the second shared source contact extends across the shared cell boundary from the first cell structure to the second cell structure along the second direction.

3. The CAM array of claim 2, wherein the first shared source contact is coupled to a first metal match line and the second shared source contact is coupled to a first metal ground line, the first metal match line and the first metal ground line being aligned with each other at the shared cell boundary along the first direction.

4. The CAM array of claim 1, wherein the first cell structure and the second cell structure each are formed of static random access memory (SRAM) cells having 8 transistors and 2 ports.

5. The CAM array of claim 4, wherein the CAM array is a ternary content addressable memory (TCAM) array.

6. The CAM array of claim 1, wherein the first storage circuit includes a pass-gate transistor, the pass-gate transistor having a gate, a drain, and a source each formed over the substrate, the gate of the pass-gate transistor coupled to a word line,
wherein the first shared source contact is coupled to a match line, and the word line and the match line are in different metal layers.

7. The CAM array of claim 6, wherein the word line and the match line both extend along the second direction across a total length of the first and second cell structures.

8. The CAM array of claim 6, wherein the match line is coupled to a match line landing pad, the match line having a greater length than a length of the match line landing pad along the second direction and the match line and match line landing pad are in different metal layers.

9. The CAM array of claim 8, wherein the match line landing pad and the word line are in a same metal layer.

10. The CAM array of claim 9, wherein the word line is partially recessed with a dent to accommodate for a spacing between the word line and the match line landing pad.

11. A ternary content addressable memory (TCAM) array comprising:
a first TCAM cell over a substrate;
a second TCAM cell over the substrate, wherein the first and second TCAM cells share a cell boundary along a first direction;
a plurality of first metal lines over the substrate and extending in the first direction, wherein one of the first metal lines extends at the cell boundary; and
a plurality of second metal lines over the plurality of first metal lines and extending in a second direction perpendicular to the first direction,
wherein the plurality of second metal lines include a first word line, a second word line, and a match line landing pad,
wherein the first and second word lines span across a total length of the first and second TCAM cells and the match line landing pad spans across a partial length of the first and second TCAM cells, the match line landing pad sandwiched between and surrounded by the first and second word lines such that the match line landing pad is positioned within a recessed portion of the first and second word lines.

12. The TCAM array of claim 11, wherein the match line landing pad is shorter than the first and second word lines along the second direction.

13. The TCAM array of claim 11, wherein the one of the first metal lines is a first metal match line electrically coupled to the match line landing pad.

14. The TCAM array of claim 13, wherein another one of the first metal lines is a first metal ground line that also extends at the cell boundary, wherein the plurality of second metal lines further include a second metal ground line electrically coupled to the first metal ground line.

15. The TCAM array of claim 14, further comprising:
a plurality of third metal lines over the plurality of second metal lines and extending in the first direction; and
a plurality of fourth metal lines over the plurality of third metal lines and extending in the second direction, the plurality of fourth metal lines having a pinout match line and a pinout ground line,
wherein the third metal lines couple the match line landing pad to the pinout match line and couple the second metal ground line to the pinout ground line.

16. The TCAM array of claim 15, wherein the pinout match line and the pinout ground line span across the total length of the first and second TCAM cells.

17. A method for forming a content addressable memory (TCAM) array comprising:
- forming a first and a second TCAM cell, the first TCAM cell having a first storage circuit region and a first comparison circuit region, the second TCAM cell having a second storage circuit region and a second comparison circuit region, each of the first and second storage and comparison circuit regions formed from a plurality of transistors on a semiconductor substrate, the plurality of transistors each includes gate and source/drain (S/D) features, wherein the first comparison circuit region is directly adjacent to the second comparison circuit region at a cell boundary; and
- forming shared S/D contacts that span across the cell boundary, wherein the shared S/D contacts land on first S/D features in the first comparison circuit region and on second S/D features in the second comparison circuit region.

18. The method of claim 17, further comprising:
- forming first metal lines that extends along a first direction, the first metal lines being used as first metal bit lines, first metal bit line bars, first metal search lines, first metal search line bars, first metal word lines, first metal power lines, first metal ground lines, and a first metal match line, each of which are in a first metal layer;
- cutting a set of the first metal lines to form the first metal word lines and the first metal match line, wherein the cut forms separate metal strips that align with each other in the first direction; and
- forming second metal lines that extend along a second direction perpendicular to the first direction, the second metal lines include second metal word lines, second metal ground lines, and a match line landing pad, each of which are in a second metal layer, wherein the second metal word lines electrically connect to the first metal word lines, the second metal ground lines electrically connect to the first metal ground lines, and the match line landing pad electrically connects to the first metal match line,
- wherein the forming of the second metal lines includes forming the second metal word lines to have a recessed portion such that the match line landing pad is formed between the recessed portion of the second metal word lines, and the match line landing pad is shorter than the second metal word lines along the second direction.

19. The method of claim 18, further comprising:
- forming third metal lines that extend along the first direction, the third metal lines include third metal ground pads and a third metal match line pad, each of which are in a third metal layer, wherein the third metal ground pads electrically connect to the second metal word lines and the third metal match line pad electrically connect to the match line landing pad; and
- forming fourth metal lines that extend along the second direction, the fourth metal lines include fourth metal ground lines and a fourth metal match line, each of which are in a fourth metal layer, where the fourth metal ground lines electrically connect to the third metal ground pads and the fourth metal match line electrically connects to the third metal match line pad.

20. The method of claim 18, further comprising:
- forming bit line and bit line bar contact pads in the first metal layer, each of which are electrically connected to the first metal bit lines and first metal bit line bars, respectively; and
- forming search line and search line bars contact pads in the second metal layer, each of which are electrically connected to the first metal search lines and first metal search line bars, respectively.

* * * * *